United States Patent
Kawashima et al.

(10) Patent No.: US 9,437,684 B2
(45) Date of Patent: Sep. 6, 2016

(54) METHOD OF PRODUCING MICROSTRUCTURE OF NITRIDE SEMICONDUCTOR AND PHOTONIC CRYSTAL PREPARED ACCORDING TO THE METHOD

(71) Applicant: CANON KABUSHIKI KAISHA, Tokyo (JP)

(72) Inventors: Shoichi Kawashima, Kawasaki (JP); Takeshi Kawashima, Tokyo (JP); Yasuhiro Nagatomo, Kawasaki (JP); Katsuyuki Hoshino, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/336,978

(22) Filed: Jul. 21, 2014

(65) Prior Publication Data

US 2014/0327015 A1 Nov. 6, 2014

Related U.S. Application Data

(62) Division of application No. 13/002,627, filed as application No. PCT/JP2010/004768 on Jul. 27, 2010, now Pat. No. 8,791,025.

(30) Foreign Application Priority Data

Jul. 30, 2009 (JP) .................... 2009-178421

(51) Int. Cl.
*H01L 29/15* (2006.01)
*H01L 29/20* (2006.01)
(Continued)

(52) U.S. Cl.
CPC ........... *H01L 29/2003* (2013.01); *B82Y 20/00* (2013.01); *G02B 6/1225* (2013.01);
(Continued)

(58) Field of Classification Search
CPC ............ H01L 29/2003; H01L 29/201; H01L 29/045; H01L 29/20; H01L 21/02516; H01L 21/0254; H01L 21/02658; H01L 29/06
USPC ...... 257/74, 75, 76, 79, 94, 96, 103, 78, 85; 216/39, 41, 48
See application file for complete search history.

(56) References Cited

U.S. PATENT DOCUMENTS

| 7,097,920 B2 | 8/2006 | Usui et al. |
| 7,112,826 B2 * | 9/2006 | Motoki et al. ................. 257/103 |

(Continued)

FOREIGN PATENT DOCUMENTS

| JP | 2004-111766 A | 4/2004 |
| JP | 2006-245132 A | 9/2006 |
| JP | 2009-130110 A | 6/2009 |

OTHER PUBLICATIONS

PCT International Search Report and Written Opinion of the International Searching Authority, International Application No. PCT/JP2010/004768, Mailing Date May 14, 2012.

Matsubara, et al., "GaN Photonic-Crystal Surface-Emitting Laser at Blue-Violet Wavelengths", Science, vol. 319, Jan. 25, 2008, pp. 445-447.

*Primary Examiner* — Lan Vinh
(74) *Attorney, Agent, or Firm* — Fitzpatrick, Cella, Harper & Scinto

(57) ABSTRACT

The method of producing a GaN-based microstructure includes a step of preparing a semiconductor structure provided with a trench formed in a main surface of the nitride semiconductor and a heat-treating mask covering a main surface of the nitride semiconductor excluding the trench, a first heat-treatment step of heat-treating the semiconductor structure under an atmosphere containing nitrogen element to form a crystallographic face of the nitride semiconductor on at least a part of a sidewall of the trench, a step of removing the heat-treating mask after the first heat-treatment step and a second heat-treatment step of heat-treating the semiconductor structure under an atmosphere containing nitrogen element to close an upper portion of the trench on the sidewall of which the crystallographic face is formed with a nitride semiconductor.

16 Claims, 21 Drawing Sheets

(51) Int. Cl.
*B82Y 20/00* (2011.01)
*G02B 6/122* (2006.01)
*G02B 6/136* (2006.01)
*H01L 21/02* (2006.01)
*H01L 29/04* (2006.01)
*H01S 5/10* (2006.01)
*H01S 5/20* (2006.01)
*H01S 5/323* (2006.01)

(52) U.S. Cl.
CPC .......... *G02B 6/136* (2013.01); *H01L 21/0237* (2013.01); *H01L 21/0254* (2013.01); *H01L 21/02458* (2013.01); *H01L 21/02513* (2013.01); *H01L 21/02516* (2013.01); *H01L 21/02658* (2013.01); *H01L 21/02667* (2013.01); *H01L 29/045* (2013.01); *H01S 5/105* (2013.01); *H01S 5/2095* (2013.01); *H01S 5/32341* (2013.01)

(56) References Cited

U.S. PATENT DOCUMENTS

| | | | |
|---|---|---|---|
| 7,342,261 B2* | 3/2008 | Wuu | H01L 33/007 257/190 |
| 7,732,236 B2 | 6/2010 | Nakahata et al. | |
| 7,803,645 B2 | 9/2010 | Murata | |
| 2002/0031851 A1 | 3/2002 | Linthicum et al. | |
| 2003/0207125 A1* | 11/2003 | Sunakawa et al. | 428/428 |
| 2004/0251519 A1 | 12/2004 | Sugahara et al. | |
| 2005/0101100 A1* | 5/2005 | Kretchmer et al. | 438/424 |
| 2006/0131590 A1* | 6/2006 | Takakura et al. | 257/79 |
| 2006/0160334 A1 | 7/2006 | Park | |
| 2006/0272572 A1* | 12/2006 | Uematsu | C30B 25/18 117/84 |
| 2007/0029643 A1* | 2/2007 | Johnson et al. | 257/651 |
| 2007/0166982 A1 | 7/2007 | Preusse et al. | |
| 2007/0269918 A1 | 11/2007 | Cho et al. | |
| 2008/0128731 A1 | 6/2008 | DenBaars et al. | |
| 2011/0039364 A1 | 2/2011 | Kawashima et al. | |

* cited by examiner

METHOD OF PRODUCING MICROSTRUCTURE OF NITRIDE SEMICONDUCTOR AND PHOTONIC CRYSTAL PREPARED ACCORDING TO THE METHOD

This application is a divisional of application Ser. No. 13/002,627, which was the National Stage of International Application No. PCT/JP2010/004768, filed Jul. 27, 2010, which claims priority to Japanese Application No. 2009-178421, filed on Jul. 30, 2009. The contents of each of the foregoing applications are incorporated herein by reference.

BACKGROUND OF THE INVENTION

The present invention relates to a method of producing a microstructure of a nitride semiconductor. In particular, the present invention relates to a production method by which a microstructure is formed inside of a nitride semiconductor and a technology that is utilized in a method of producing light-emitting elements and the like with a photonic crystal.

BACKGROUND ART

Photonic crystals are nanostructures where a refractive index thereof is modulated with a period equal to or less than a wavelength of light. Among these, photonic crystals functioning in a visible region are constituted of a plurality of holes having a magnitude of several tens to hundred and several tens nanometer order. When a photonic crystal is a structure buried inside of a semiconductor, a high producing technology becomes necessary.

On the other hand, on semiconductor layers that sandwich the buried photonic crystal, another semiconductor layer and an electrode can be stacked, accordingly, there is an advantage that a photonic crystal device capable of injecting a current in a stacking direction can be realized.

In Patent Literature 1, a technology where a mass-transport phenomenon is used to form fine holes inside of a nitride semiconductor is disclosed and also a method of preparing a GaN-based photonic crystal surface-emitting laser is disclosed. A specific procedure thereof is as follows.

Firstly, trenches are formed on a surface of a nitride semiconductor by EB lithography and dry etching. During the dry etching, a $SiO_2$ hard mask is used. Then, after the trenches are formed, the hard mask is removed and a heat treatment is conducted at 1000 degrees Celsius in an atmosphere containing nitrogen. As the result thereof, a mass transport of surface atoms is generated and finally an upper portion of the trench is closed and thereby an air hole is formed. Then, on the photonic crystal, a laser structure containing an active layer is epitaxially grown, and thereby a GaN-based surface-emitting laser is prepared.

CITATION LIST

Patent Literature

[PTL 11] Japanese Patent Application Laid-Open No. 2004-111766 (Fifth example, FIG. 11)

SUMMARY OF INVENTION

Technical Problem

The optical property of a photonic crystal depends on sizes and geometries of holes. In order to obtain a photonic crystal device having characteristics as designed, sizes and geometries of holes have to be controlled with high precision. That is, when the sizes of trenches greatly vary in the process of production, a photonic crystal having an excellent optical property is difficult to obtain. In the etching step where trenches are formed on a semiconductor surface, a semiconductor etching technology has been established. That is, in the producing step, sizes of trenches and in-plane fluctuations thereof can be controlled with high precision.

However, in the process disclosed in Patent Literature 1, there is a problem that after a heat-treatment step following an etching step of forming trenches on a semiconductor surface, sizes of the trenches become larger than those of trenches before the heat treatment step.

In this connection, the present invention intends to provide a method of producing a GaN-based microstructure, by which, without greatly varying sizes of trenches formed by precisely controlling in the etching step of a semiconductor even after the heat treatment step is conducted, a microstructure containing holes inside of a semiconductor can be formed.

Solution to Problem

The present invention provides a method of producing a GaN-based microstructure constituted as illustrated below.

A method of producing a microstructure of a nitride semiconductor according to the present invention includes a step of preparing a semiconductor structure provided with a trench formed in a main surface of the nitride semiconductor and a heat-treating mask covering a main surface of the nitride semiconductor excluding the trench, a first heat-treatment step of, after the step of preparing a semiconductor structure, heat-treating the semiconductor structure under an atmosphere containing nitrogen element to form a crystallographic face of the nitride semiconductor on at least a part of a sidewall of the trench, a step of removing the heat-treating mask after the first heat-treatment step and a second heat-treatment step of, after the step of removing the heat-treating mask, heat-treating the semiconductor structure under an atmosphere containing nitrogen element to close an upper portion of the trench on the sidewall of which the crystallographic face is formed with a nitride semiconductor.

Advantageous Effects of Invention

According to the present invention, a method of producing a GaN-based microstructure, by which, without greatly varying sizes of trenches formed by precisely controlling in an etching step of a semiconductor even after a heat treatment step is conducted, a microstructure containing holes inside of a semiconductor can be formed is realized.

DESCRIPTION OF EMBODIMENTS

A method of producing a GaN-based microstructure in an embodiment of the present invention will be described below.

Embodiment 1

A method of producing a GaN-based microstructure in Embodiment 1 to which the present invention is applied will be described with reference to FIGS. 1A, 1B, 1C, 1D, 1E and 1F.

(Crystal Growth Step of a Nitride Semiconductor Layer)

A crystal growth step of a nitride semiconductor layer, that is a step by which a nitride semiconductor layer is formed on a substrate, will be described.

Figure 1A:
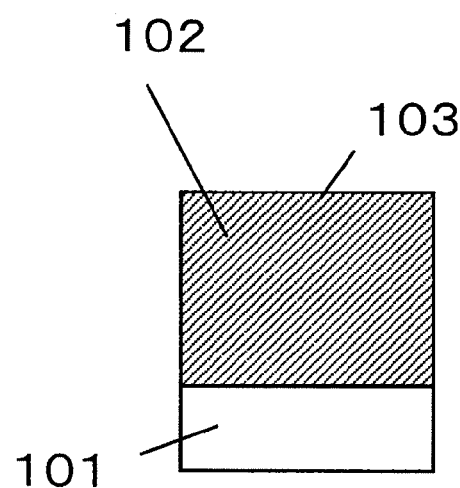
FIG. 1A is a diagram illustrating a method of producing a GaN-based microstructure according to Embodiment 1.

As illustrated in FIG. 1A, a first nitride semiconductor layer 102 that is a nitride semiconductor is stacked on a substrate 101. The substrate 101 is, for example, hexagonal, and more specifically, can be any of GaN, sapphire and SiC. The first nitride semiconductor layer 102 is any of nitride semiconductors such as MN, AlGaN, GaN, InGaN, and InN. In the present embodiment, the substrate 101 is a GaN substrate and the first nitride semiconductor layer 102 is GaN. The first nitride semiconductor layer 102 is grown on the substrate 101 by, for example, a metal organic vapor phase epitaxy (MOVPE) method. In addition, in the present embodiment, a main surface 103 of the first nitride semiconductor layer 102 is (0001) surface.

(Step of Forming an Etching Mask)

A step of forming an etching mask will be described below.

Figure 1B:
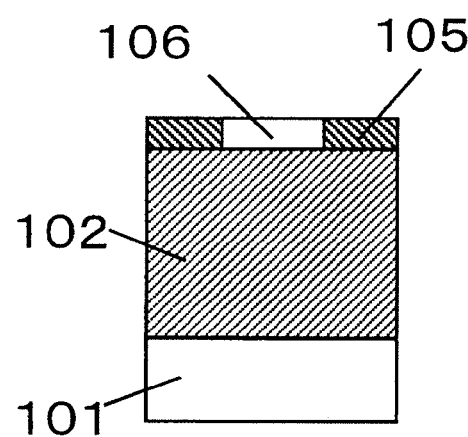
FIG. 1B is a diagram illustrating a method of producing a GaN-based microstructure according to Embodiment 1.

FIG. 1B is a diagram illustrating a step of forming, after the step of FIG. 1A, an etching mask 105 for forming the trenches 104 on the main surface 103 of the first nitride semiconductor layer 102. In what follows, the step of FIG. 1B will be described in order. A material of an etching mask 105 is deposited on the main surface 103 of the first nitride semiconductor layer 102 by plasma CVD (Chemical Vapor Deposition).

A material of the etching mask 105 can be any of, for example, silicon oxide, silicon nitride and silicon oxynitride, which are easy to process.

In the present embodiment, the material of the etching mask 105 is silicon oxide. A deposition process of the etching mask may be a sputtering process or an electron beam evaporation process. Subsequently, openings 106 are formed in the etching mask 105. Photolithography and etching are used to form the openings 106. The lithography may be electron beam lithography or nano-imprint lithography. When the openings 106 are formed by etching, either one of wet etching and dry etching may be used. However, in order to improve size controllability of the opening 106, the dry etching with ICP (Inductively Coupled Plasma) can be used. The opening 106 in the present embodiment is a circle having a diameter of 1 micrometer.

(Step of Forming Trenches)

A step of forming trenches will be described below.

Figure 1C:
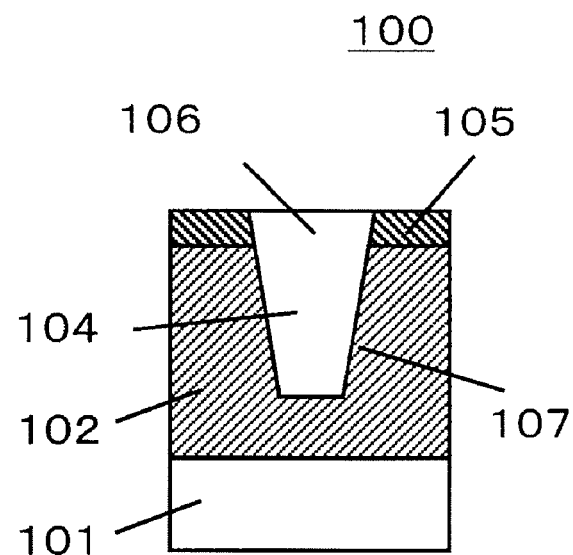
FIG. 1C is a diagram illustrating a method of producing a GaN-based microstructure according to Embodiment 1.

FIG. 1C is a diagram illustrating, after the step of FIG. 1B, a step of forming a trench 104 by etching the first nitride semiconductor layer 102. In the step of forming trenches 104, any of wet etching and dry etching may be used. However, in order to improve size controllability of the trenches 104, the dry etching with ICP can be used. A plasma composition used in a dry etching step for forming the trenches 104 contains, for example, any element of Cl, Br and I.

More specifically, mixed gas plasma of any gas of $Cl_2$, $BCl_3$, HBr, HI and HCl and any gas of He, Ar, Xe and $N_2$ can be used. According to the steps of FIG. 1A to FIG. 1C, a semiconductor structure 100 having the trenches 104 formed in a main surface 103 of the first nitride semiconductor layer 102 and a mask disposed on the main surface 103 of the first nitride semiconductor 102 excluding places where the trenches 104 are formed is prepared.

The trench 104 in the present embodiment has a circular geometry having a diameter of 1 micrometer at an upper portion and a depth of 2.5 micrometers.

(First Heat-Treatment Step)

Then, a heat treatment step illustrated in FIG. 1D will be described.

In what follows, the heat-treatment step will be described as a first heat-treatment step. FIG. 1D is a diagram illustrating, after the step of FIG. 1C, a first heat-treatment step of heat-treating the semiconductor structure 100 under an atmosphere containing nitrogen element that is group V.

Figure 1D:
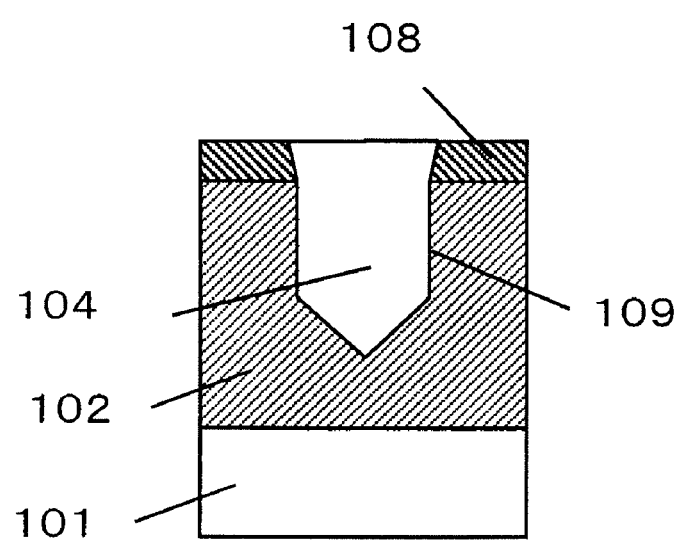
FIG. 1D is a diagram illustrating a method of producing a GaN-based microstructure according to Embodiment 1.

In the step of FIG. 1D, mass transport is caused in a sidewall 107 of the trench 104 to form a crystallographic face 109 of a nitride semiconductor constituting a first nitride semiconductor layer 102 in at least part of the sidewall 107. The mass transport is a phenomenon where atoms are desorbed from a surface owing to thermal energy, transported and reabsorbed at positions where a surface energy becomes smaller. While maintaining a semiconductor composition, a surface geometry can be varied or a crystallographic face can be formed.

(Atmosphere of First Heat-Treatment Step)

An atmosphere of the first heat-treatment step will be described below.

The first heat-treatment step is conducted under an atmosphere containing nitrogen element that is V group such as $N_2$ or $NH_3$. The reason why the heat treatment is conducted under group V atmosphere is because group V elements are more readily desorbed than group III elements, and thereby, when a heat treatment is conducted under an atmosphere where group V element is fed, the group V element is inhibited from decreasing from the first nitride semiconductor layer 102.

(Crystallographic Face Formation According to First Heat-Treatment Step)

Then, formation of a crystallographic face according to the first heat-treatment step will be described.

In the present embodiment, a main surface 103 of the first nitride semiconductor layer 102 is (0001) surface, accordingly, on a sidewall 107 after the first heat-treatment step, any of the following (1-10n (here, n is an integer of 0 to 4)) surfaces is formed. That is, on the sidewall 107 after the first heat-treatment step, a crystallographic face 109 equivalent to (1-100) surface vertical to the main surface 103 is formed. Alternatively, a crystallographic face 109 equivalent to any of about 62 degrees inclined (1-101) surface, about 43 degrees inclined (1-102) surface, about 32 degrees inclined (1-103) surface and about 25 degrees inclined (1-104) surface is formed.

When the main surface 103 of the first nitride semiconductor layer 102 is (1-100) surface, on the sidewall 107, a crystallographic face 109 equivalent to (0001) surface is formed. Alternatively, any surface of the following (1-10n (here, n is an integer of 1 to 4)) surfaces is formed. That is, a crystallographic face 109 equivalent to any of (1-101) surface, (1-102) surface, (1-103) surface and (1-104) surface is formed.

Furthermore, that the crystallographic face 109 is formed by the first heat-treatment step means that crystalline of a trench 104 surface is improved.

When a trench 104 is formed by, for example, dry etching, owing to an impact of ions in plasma, on a surface of the trench 104, a lot of atomic level defects are generated. However, when a crystallographic face 109 is formed by mass transport, atoms are rearranged so as to repair the defects, as the result thereof, a surface more excellent in the crystalline than before the heat treatment can be obtained.

Furthermore, when the mass transport in the first heat-treatment step can form a crystallographic face 109 vertical to the main surface 103, the trench 104 formed by dry etching can be used to reshape. That is, during the dry etching, a pull-in voltage of ions in the plasma is lowered to sacrifice a verticality of the sidewall 107 to inhibit defects from being generated by ion impact.

In the next place, the verticality of the sidewall 107 is improved by the first heat-treatment step and simultaneously therewith defects of the surface are repaired, thereby, the verticality of the trench 104 and the crystalline of the sidewall 107 can be improved more than these immediately after the dry etching.

(Function of Heat-Treating Mask in First Heat-Treatment Step)

A function of a heat-treating mask in the first heat-treatment step will be described below.

In the first heat-treatment step illustrated in FIG. 1D, the main surface 103 of the first nitride semiconductor layer 102 excluding the trenches 104 is covered with the heat-treating mask 108. This is because the size of the trench 104 is suppressed from greatly varying owing to excessive mass transport. That is, unless the main surface 103 of the first nitride semiconductor layer 102 other than the trenches 104 is covered with the heat-treating mask 108, atoms desorbed at a surface of the first nitride semiconductor layer 102 are, after intruding inside of the trenches 104, adsorbed on the sidewall 107. As the result thereof, a diameter or a depth of the trench 104 becomes smaller.

In the present embodiment, relative to a diameter of 1 micrometer of the opening 106, a trench 104 diameter (a distance between opposite sidewalls) after the first heat-treatment step was almost the same, that is, about 1 micrometer.

Furthermore, in the present embodiment, as the heat-treating mask 108 covering a main surface of the nitride semiconductor excluding the trenches 104, the etching mask 105 used when the trenches 104 are formed is used. However, after the formation of the trenches 104, the etching mask 105 is once removed, and in a region where excessive mass transport would be suppressed, a heat-treating mask 108 may be formed by patterning. On this occasion, the heat-treating mask 108 is formed by, for example, photolithography and etching.

(Material of Heat-Treating Mask)

Next, a material constituting the heat-treating mask 108 will be described.

A melting point of the material of the heat-treating mask 108 can be higher than a temperature of the first heat-treatment step. As the result thereof, the material of the heat-treating mask 108 is inhibited from diffusing inside of the first nitride semiconductor layer 102. The material of the heat-treating mask 108 can be, for example, a semiconductor oxide or a metal oxide. For example, the heat-treating mask 108 can be any of silicon oxide, silicon nitride, silicon oxynitride, aluminum oxide, hafnium oxide and zirconium oxide. In the present embodiment, the heat-treating mask 108 is silicon oxide.

(Step of Removing Heat-Treating Mask)

A step of removing the heat-treating mask will be described below.

Figure 1E:
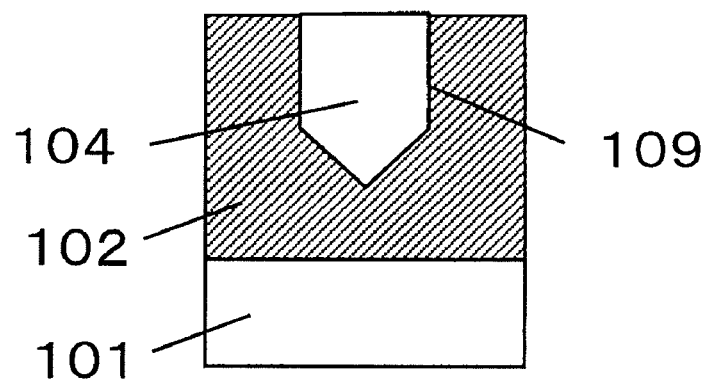
FIG. 1E is a diagram illustrating a method of producing a GaN-based microstructure according to Embodiment 1.

FIG. 1E is a diagram illustrating the step of removing the heat-treating mask 108, the step following the step illustrated in FIG. 1D. As a removing method, wet etching can be used because it does not physically damage a surface of the first nitride semiconductor layer 102.

(Second Heat-Treatment Step)

Figure 1F:
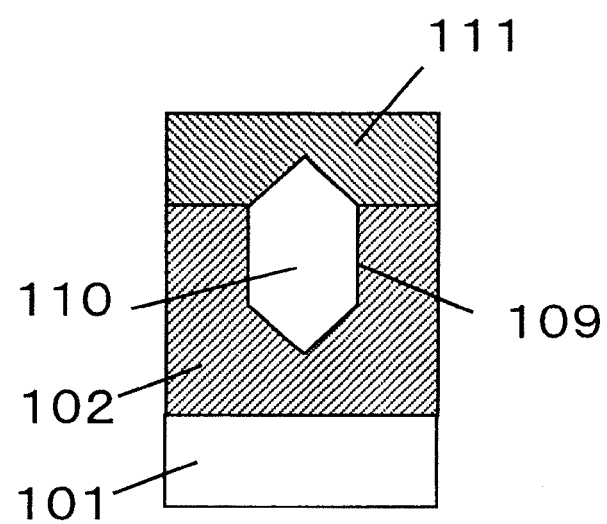
FIG. 1F is a diagram illustrating a method of producing a GaN-based microstructure according to Embodiment 1.

Then, a second heat-treatment step will be described. FIG. 1F is a diagram illustrating the step of forming a hole inside of a semiconductor layer, the step following the step illustrated in FIG. 1E. That is, a semiconductor structure 100 is heat treated under an atmosphere containing nitrogen element that is V group. This is a drawing describing a step where thereby, an upper portion of the trench 104 is closed with a second nitride semiconductor layer 111 to form a hole 110 inside of a semiconductor layer in which a first nitride semiconductor layer 102 and a second nitride semiconductor layer 111 are stacked on a substrate 101.

In the present embodiment, the second nitride semiconductor layer 111 is GaN, that is, the same composition as the first nitride semiconductor layer 102. In what follows, the heat treatment of FIG. 1F is taken as a second heat-treatment step. While, in the first heat-treatment step, the heat-treating mask 108 is used, the second heat-treatment step is different in that the heat-treating mask 108 is not used.

(Atmosphere of Second Heat-Treatment Step)

An atmosphere of the second heat-treatment step will be described below.

The second heat-treatment step is conducted under an atmosphere containing nitrogen element that is group V, that is, under an atmosphere containing, for example, $N_2$ or $NH_3$. However, the second heat-treatment step can be conducted under an atmosphere containing group III element in addition thereto. As an atmosphere containing nitrogen element or an atmosphere containing group III element in addition to an atmosphere containing nitrogen element, an atmosphere such as illustrated below is used. For example, when the second nitride semiconductor layer 111 is AlGaN, the second heat-treatment step is conducted under an atmosphere containing $N_2$ and $NH_3$, in addition thereto, TMA (trimethyl aluminum) and TMG (trimethyl gallium).

Furthermore, for example, when the second nitride semiconductor layer 111 is InGaN, the second heat-treatment step is conducted under an atmosphere containing $N_2$ and $NH_3$, in addition thereto, TMG and TMI (trimethyl indium).

In the present embodiment, since the second nitride semiconductor layer 111 is GaN, the second heat-treatment step is conducted under an atmosphere containing $N_2$ and $NH_3$, in addition thereto, TMG.

(Effect of Crystallographic Face Formed by First Heat-Treatment Step in Second Heat-Treatment Step)

An effect of a crystallographic face formed by the first heat-treatment step in the second heat-treatment step will be described below.

That a heat treatment is conducted under an atmosphere containing both group V element and group III element is equivalent for a crystal growth step.

In the second heat-treatment step, the crystallographic face 109 formed on the sidewall 107 in the first heat-treatment step works effectively. That is, since the crystallographic face 109 is formed on the sidewall 107, a crystal growth rate can be controlled. For example, when, in a state where the crystallographic face 109 formed on the sidewall 107 is (1-100) surface, the heat treatment in the second heat-treatment step is conducted under the conditions where a growth rate of the (1-100) surface is slower than those of (0001) surface and (1-101) surface, a trench can be closed as shown below.

That is, without greatly varying a trench diameter of the trench 104, an upper portion of the trench 104 can be closed with a second semiconductor 111.

In the present embodiment, while a diameter of an upper portion of the trench 104 is 1 micrometer, a trench diameter of the trench 104 after the second heat treatment is about 900 nm not larger than 1 micrometer, that is, suppressed to a variation of only about 10%.

Furthermore, for example, when, in a state where the crystallographic face 109 formed on the sidewall 107 is (1-101) surface, the heat treatment in the second heat-treatment step is conducted under the conditions where a growth rate of the (1-101) surface is slower than those of (0001) surface and (1-100) surface, a trench can be closed as illustrated below.

That is, without greatly varying a depth of the trench 104, an upper portion of the trench 104 can be closed with the second semiconductor 111.

In the present embodiment, while a diameter of the upper portion of the trench 104 is 1 micrometer, in order to close the upper portion of the trench 104, a depth of the trench 104 can be a depth where an aspect ratio thereof is 2 or more.

Furthermore, when a diameter of the upper portion of the trench 104 is 300 nm or less, even the depth of the trench 104 is two or less in the aspect ratio, the upper portion of the trench 104 can be closed. In order to make a variation amount of the trench diameter of the trench 104 before and after the second heat-treatment step smaller, a diameter of the upper portion of the trench 104 before the second heat-treatment step can be 150 nm or less. A growth rate is controlled mainly by optimizing a temperature parameter of an atmosphere. In particular, in the present embodiment, because the first nitride semiconductor layer 102 and the second nitride semiconductor layer 111 have the same composition, temperature optimization can be arbitrarily conducted.

(Shape of Hole after the Second Heat Treatment)

A shape of a hole after the second heat treatment will be described below.

When a main surface 103 of the first nitride semiconductor layer 102 is (0001) surface, a hole 110 formed after the second heat treatment is a polyhedron containing any crystallographic face 109 equivalent to following surfaces. That is, the polyhedron contains crystallographic face 109 equivalent to any of (0001) surface, (1-100) surface, (1-101) surface, (1-102) surface, (1-103) surface and (1-104) surface.

Figure 2A:
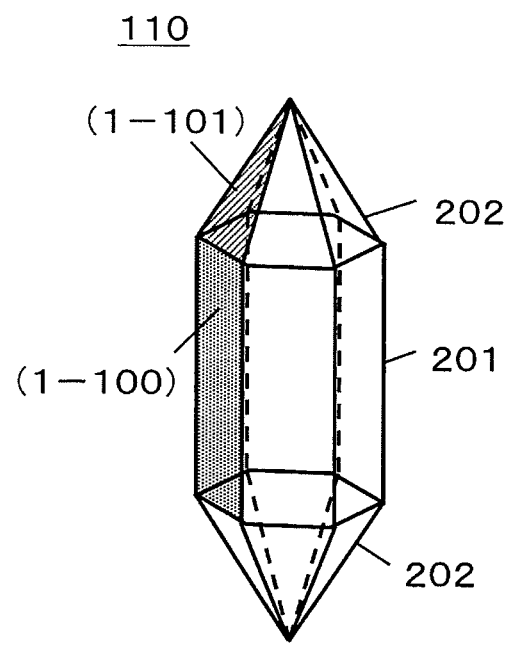
FIG. 2A is a perspective view of a hole formed according to a production method in Embodiment 1.
Figure 2B:
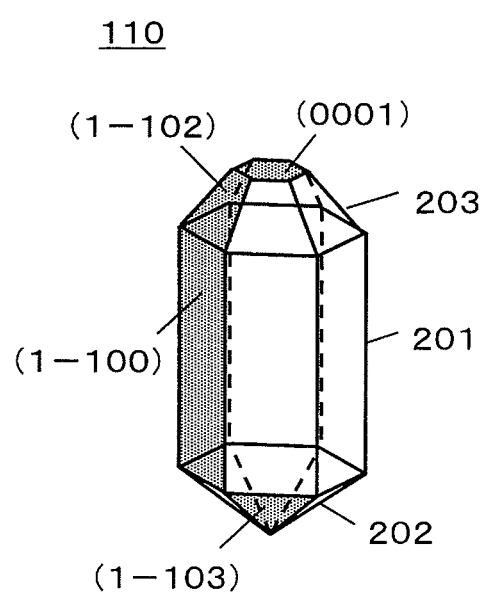
FIG. 2B is a perspective view of a hole formed according to a production method in Embodiment 1.

For example, FIG. 2A and FIG. 2B each are a diagram illustrating an example of a hole 110 formed after the second heat treatment.

In FIG. 2A, a hole 110 has a structure where each of an upper end and a lower end of a hexagonal column 201 constituted of 6 crystallographic faces 109 equivalent to (1-100) surface is connected to a hexagonal cone 202 containing 6 crystallographic faces 109 equivalent to (1-101) surface.

In addition, when a depth of the hole 110 is shallow, the hole has a structure where the hexagonal column 201 is not present and the upper and lower hexagonal cones 202 are directly connected. Each apex constituting the hole 110 is not necessarily angular but may be round without angle.

Furthermore, by controlling a temperature and an atmosphere of the second heat-treatment step, the hexagonal cone 202 can be formed into a polyhedron that contains any crystallographic face 109 equivalent to (1-102) surface, (1-103) surface and (1-104) surface. For example, depending on the conditions after the second heat treatment, a hole 110 having a geometry illustrated in FIG. 2B is formed. In FIG. 2B, on a lower side (substrate side) of the hexagonal column 201, a hexagonal cone 202 containing 6 crystallographic faces equivalent to (1-103) surface is formed, and on an upper side of the hexagonal column 201, an octahedron 203 having a geometry obtained by truncating an upper portion of the hexagonal cone containing 6 crystallographic faces equivalent to (1-102) surface is formed. Each of a top surface and a bottom surface of the octahedron 203 is a surface equivalent to (0001) surface.

(Group III/Group V Ratio in the First Heat-Treatment Step and Group III/Group V Ratio in the Second Heat-Treatment Step)

A III/V group ratio in the first heat-treatment step and a III/V group ratio in the second heat-treatment step will be described below.

A relationship between a molar ratio R1 of group III/group V in an atmosphere of the first heat-treatment step and a molar ratio R2 of group III/group V in an atmosphere of the second heat-treatment step will be described.

In the present embodiment, the relationship between the molar ratio R1 and molar ratio R2 can be R1<R2. In an atmosphere where the first heat treatment is conducted, group III element is not always necessary. However, in the second heat-treatment step, it is better to feed a nitride semiconductor raw material by a portion that closes an upper portion of the trench 104, accordingly, the second heat-treatment step can be conducted under an atmosphere containing both group III element and group V element.

Furthermore, for example, when there is a requirement that a thickness of the second nitride semiconductor layer 111 formed on an upper portion of the trench 104 should be as thin as possible, R1=R2=0 is desirable. That is, in both the first heat-treatment step and the second heat-treatment step, a heat treatment can be conducted under an atmosphere that does not contain group III element.

At that time, the second heat-treatment step closes the upper portion of the trench 104 not by crystal growth but by mass transport phenomenon. By sequentially going through the steps of FIG. 1A to FIG. 1D, a hole 110 which is precisely controlled size can be formed inside of the nitride semiconductor.

Embodiment 2

In Embodiment 2, a temperature restriction is added to Embodiment 1. That is, in Embodiment 2, an example of a producing step of a GaN-based microstructure when compositions of a first nitride semiconductor layer 102 and a second nitride semiconductor layer 111 are different will be described.

A first heat-treatment step and a second heat-treatment step are different from those in Embodiment 1. When a composition of a first nitride semiconductor layer 102 is different from that of a second nitride semiconductor layer 111, each of which is a nitride semiconductor, a temperature T1 of the first heat-treatment step and a temperature T2 of the second heat-treatment step can have a relationship such as shown below.

For example, when the first nitride semiconductor layer 102 is $In_xGa_{1-x}N$ and the second nitride semiconductor layer 111 is $Al_yGa_{1-y}N$ $(0<x\leq1.0<y\leq1)$, T2 can be larger than T1. This is because $Al_yGa_{1-y}N$ has a higher melting point than $In_xGa_{1-x}N$. That is, this is because a temperature where $Al_yGa_{1-y}N$ can close an upper portion of the trench 104 in the second heat-treatment step is higher than a temperature at which $In_xGa_{1-x}N$ can form a crystallographic face 109 on the sidewall 107 by mass transport in the first heat-treatment step.

Furthermore, from the same reason, for example, when the first nitride semiconductor layer 102 is $Al_yGa_{1-y}N$ and the second nitride semiconductor layer 111 is $In_xGa_{1-x}N$ $(0<x\leq1.0<y\leq1)$, T1 can be larger than T2.

Embodiment 3

In the present Embodiment 3, by making use of the steps of Embodiment 1 or Embodiment 2, an example of a production step of a GaN-based photonic crystal constituted by arranging a plurality of the trenches will be described.

In the present Embodiment 3, a first nitride semiconductor layer 102 having trenches 104 of a photonic crystal is GaN and a second nitride semiconductor layer 111 that closes an upper portion of the trenches 104 also is GaN. The first nitride semiconductor layer 102 and the second nitride semiconductor layer 111 may be any of AlN, AlGaN, InGaN and InN.

(Step of Forming Etching Mask)

Then, a step of forming an etching mask will be described.

Figure 3A:
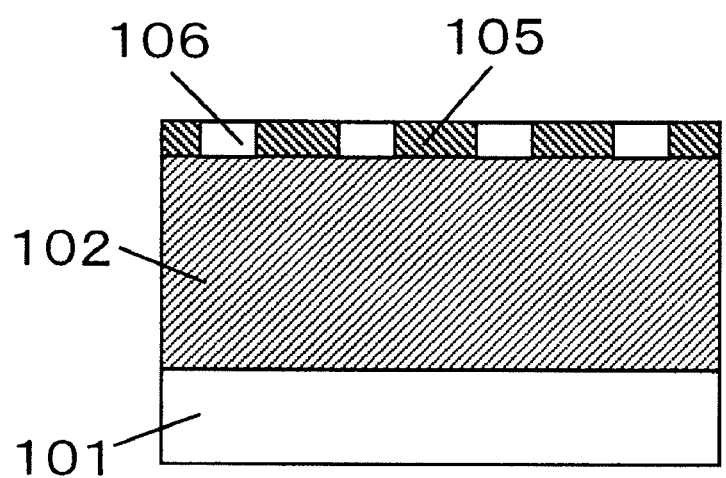
FIG. 3A is a sectional view illustrating an example of a producing step in Embodiment 3.
Figure 4:
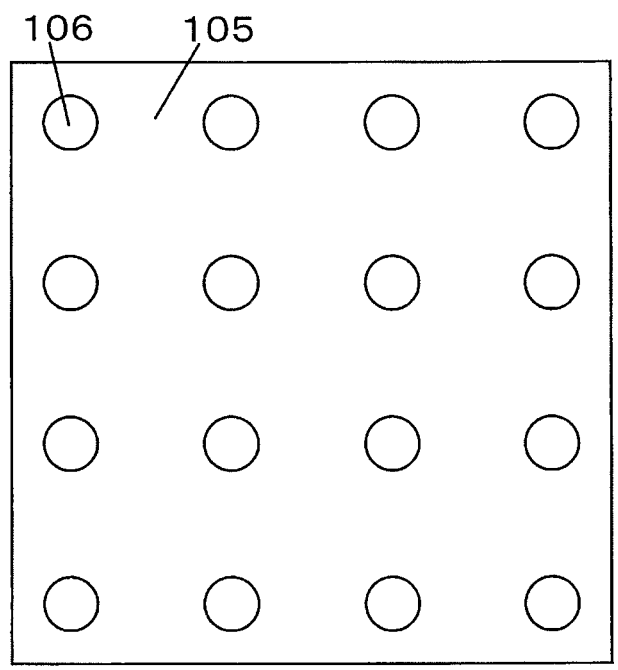
FIG. 4 is a top view of an etching mask containing openings arranged in a square lattice in Embodiment 3.

When a photonic crystal is formed, as illustrated in FIG. 3A, in a step of patterning openings 106 of the etching mask 105, a plurality of openings 106 is periodically formed. In the present Embodiment 3, a circular opening 106 having a diameter of 120 nm is patterned on an etching mask 105 in square lattice with a period of 300 nm. FIG. 4 illustrates a top view of an etching mask 105 containing openings 106 arranged in a square lattice pattern.

(Step of Forming Trenches)

Figure 3B:
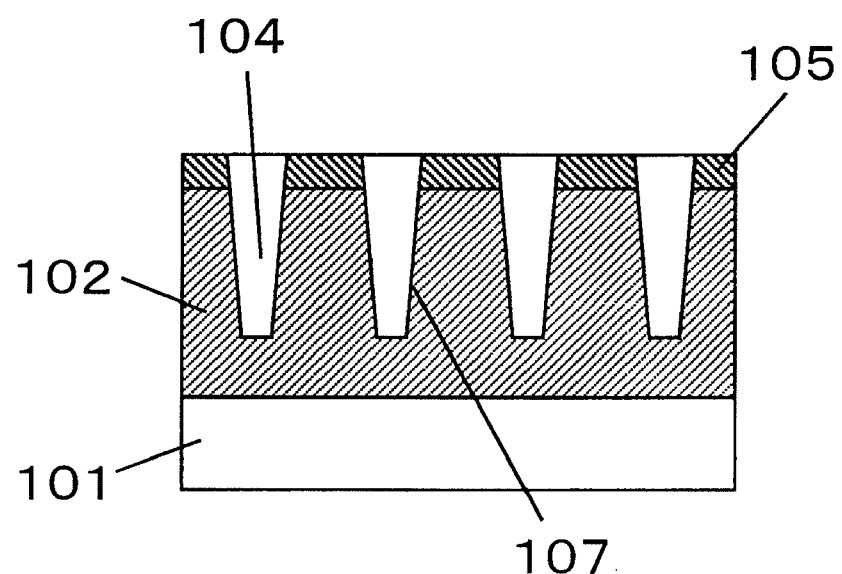
FIG. 3B is a sectional view illustrating an example of a producing step in Embodiment 3.

A step of forming trenches is conducted below. Here, following the step of FIG. 3A, as illustrated in FIG. 3B, in (0001) surface that is a main surface 103 of the first nitride semiconductor layer 102, a plurality of trenches 104 that becomes lattice points of a photonic crystal is formed by dry etching.

(First Heat-Treatment Step)

Figure 3C:
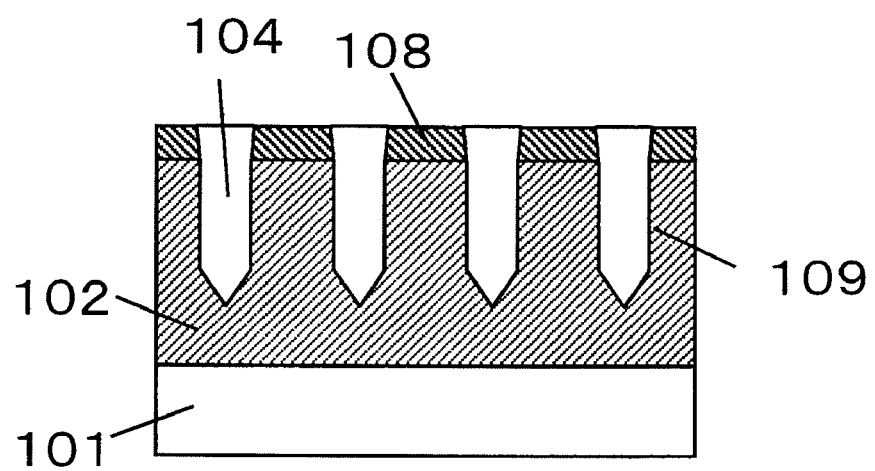
FIG. 3C is a sectional view illustrating an example of a producing step in Embodiment 3.

Subsequently, a first heat-treatment step is conducted. That is, as illustrated in FIG. 3C, a first heat-treatment step is conducted with the etching mask 105 as a heat-treating mask 108. As the result thereof, by mass transport, on a sidewall 107 of a trench 104 forming a photonic crystal, (1-100) surface vertical to main surface 103 (0001) surface of the first nitride semiconductor layer 102 is formed.

(Step of Removing Heat-Treating Mask and Second Heat-Treatment Step)

Figure 3D:
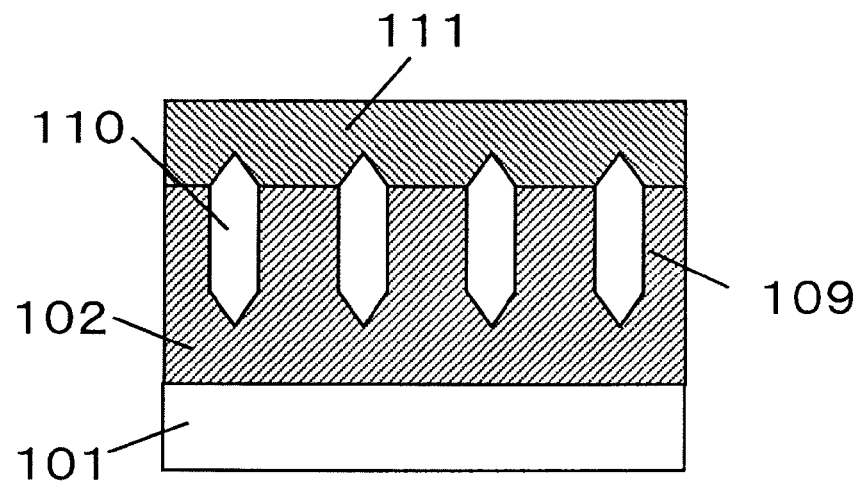
FIG. 3D is a sectional view illustrating an example of a producing step in Embodiment 3.

In the next place, a step of removing a heat-treating mask and a second heat-treatment step are carried out. That is, the heat-treating mask 108 is removed and, as illustrated in FIG. 3D, a second heat-treatment step is conducted. As the result thereof, without greatly varying a trench diameter or a trench depth of the trench 104 before and after the heat treatment, inside of the first nitride semiconductor layer 102 and second nitride semiconductor layer 111, holes 110 can be formed.

In the present Embodiment 3, a trench diameter after the second heat-treatment step was about 105 nm. Before and after the heat treatment, a variation of the size of the trench is suppressed to 15 nm. This is an effect of forming a crystallographic face 109 in the first heat-treatment step. In particular, in the case of a photonic crystal, the size of the trench 104 (hole 110) is an important parameter that determines a magnitude of diffraction efficiency; accordingly, that the size of the trench 104 is not greatly varied during the production is necessary condition for producing a photonic crystal as designed with excellent precision.

Figure 5A:
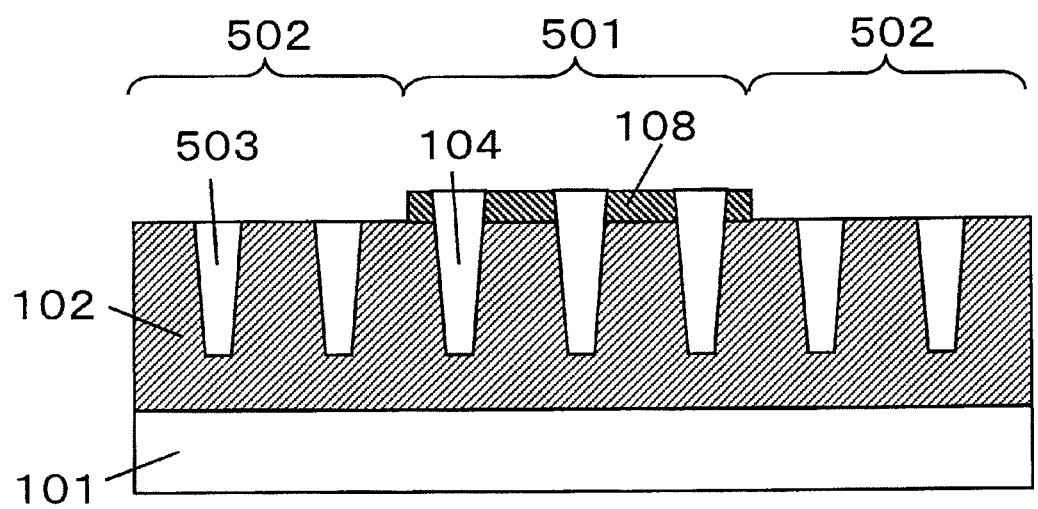
FIG. 5A is a sectional view illustrating a modification example of a producing step in Embodiment 3.
Figure 5B:
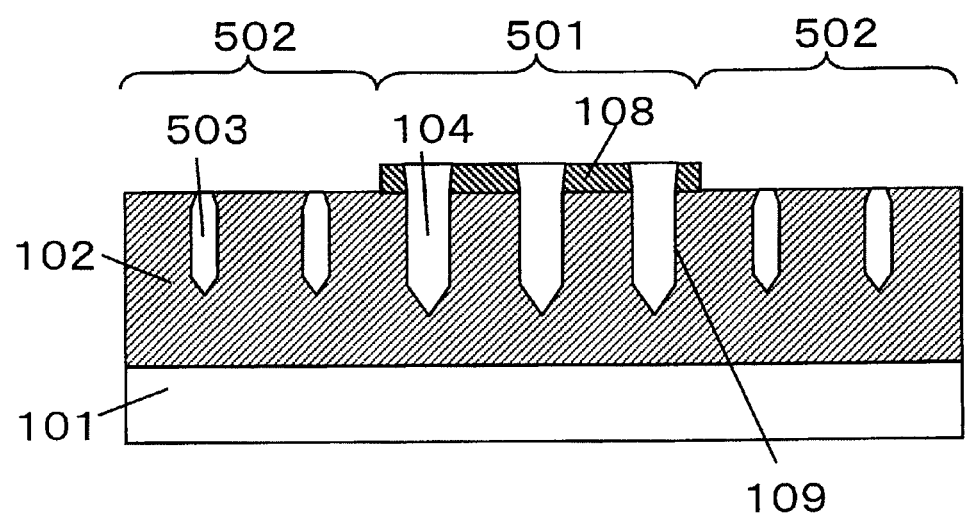
FIG. 5B is a sectional view illustrating a modification example of a producing step in Embodiment 3.
Figure 5C:
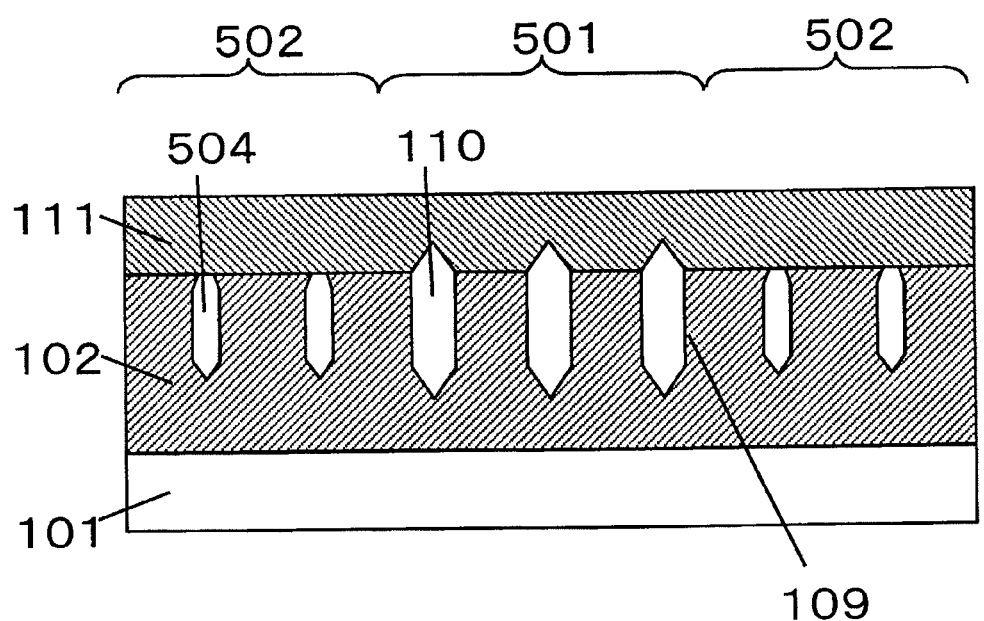
FIG. 5C is a sectional view illustrating a modification example of a producing step in Embodiment 3.

With reference to FIGS. 5A, 5B and 5C, a modification example of Embodiment 3 will be described below.

Before the first heat-treatment step of FIG. 3C, the etching mask 105, namely, the heat-treating mask 108 is partially removed and, thereafter, the first heat-treatment step is conducted, thereby, sizes of the trenches 104 constituting a photonic crystal can be intentionally varied in-plane.

FIGS. 5A, 5B and 5C illustrate an example thereof.

In FIG. 5A, a center region 501 of a photonic crystal is covered with a heat-treating mask 108 and, in an outer periphery region 502 outside thereof, a heat-treating mask 108 is removed. A selective removing method of the heat-treating mask 108 can be conducted by, for example, photolithography and wet etching.

When the first heat-treatment step is conducted following the step of FIG. 5A, as illustrated in FIG. 5B, a photonic crystal of the center region 501 covered by the heat-treating mask 108 does not vary greatly in size of the trench 104 before and after the heat treatment. However, in a photonic crystal of the outer periphery region 502 that is not covered by the heat-treating mask, for example, a depth of the trench 503 becomes shallower. Furthermore, depending on the heat treatment conditions, for example, a trench diameter of the trench 503 becomes narrower.

After that, when the heat-treating mask 108 is removed and the second heat-treatment step is subsequently conducted, as illustrated in FIG. 5C, a photonic crystal where a hole 110 in the center region 501 and a hole 504 of the outer periphery region 502 are different in size can be formed. That is, a photonic crystal having diffraction efficiency in-plane could be prepared. In other words, by selecting a region covered by a heat-treating mask, a production step where the diffraction efficiency of a photonic crystal can be freely controlled can be obtained.

Embodiment 4

In the present Embodiment 4, a case where at least one side of an upper geometry of an opening 106 of an etching mask 105 is formed so as to be in parallel with a crystallographic face 109 of a first nitride semiconductor layer 102 will be described.

In a first heat-treatment step in the present invention, by mass transport, a crystallographic face 109 of a first nitride semiconductor layer 102 is formed on a sidewall 107 of a trench 104.

In the present embodiment, since a main surface 103 of the first nitride semiconductor layer 102 is (0001) surface, in the first heat-treatment step, on a sidewall 107, (1-100) surface vertical to the main surface 103 is formed.

Figure 6A:
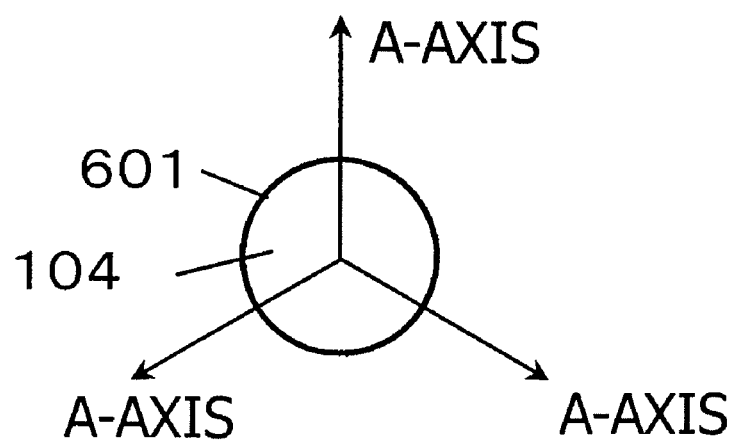
FIG. 6A is a top view of a trench before a first heat-treatment step in Embodiment 4.
Figure 6B:
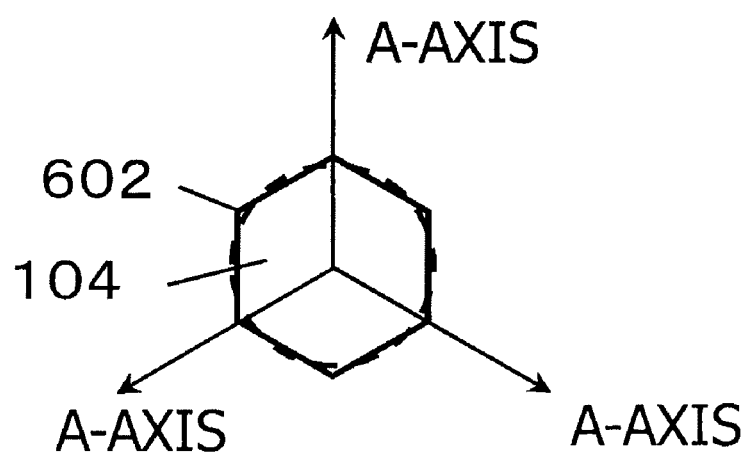
FIG. 6B is a top view of a trench before and after a first heat-treatment step in Embodiment 4.

That is, as illustrated in FIG. 6A, even if an upper geometry of the trench 104 is a circle 601 before the first heat-treatment step, after the first heat-treatment step, as illustrated in FIG. 6B, an upper geometry thereof is deformed into a hexagon 602. A trench diameter of the trench 104 is not a little varied at the time of deformation from a circle 601 to a hexagon 602. In FIG. 6B, a dashed line illustrates a size of an original circle 601.

Therefore, in the present embodiment, in order to make a variation before and after the heat treatment as small as possible, in the step of before the first heat-treatment step, a trench 104 of which upper geometry is a hexagon is prepared.

In what follows, the step thereof will be described. As an upper geometry of the trench 104 before the first heat-treatment step, a geometry of an opening 106 of the etching mask 105 is transferred. Then, in the step of patterning the opening 106, an upper geometry of the opening 106 can be patterned so as to be constituted of sides in parallel with a crystallographic face 109 of the first nitride semiconductor layer 102.

In the present embodiment, a main surface 103 is (0001) surface, accordingly, a hexagon 603 constituted of sides in parallel with a surface equivalent to (1-100) surface is patterned. A side in parallel with a surface equivalent to (1-100) surface is a side in parallel with any of [1-100] direction, [10-10] direction, [01-10] direction, [−1100] direction, [−1010] direction and [0-110] direction.

In addition, a side constituting a regular hexagon 603 may not be in complete parallel with a crystallographic face 109 of the first nitride semiconductor layer 102, that is, a deviation of not less than −10 degrees and not more than +10 degrees can be permitted.

Figure 6C:
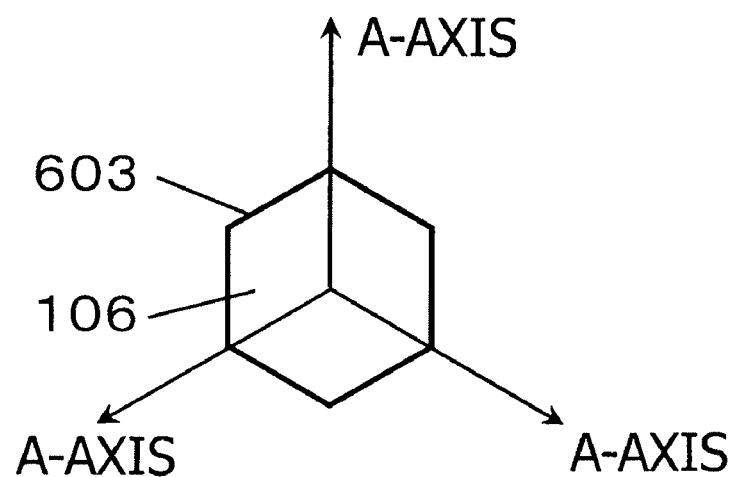
FIG. 6C is a top view of a trench before a first heat-treatment step in Embodiment 4.
Figure 6D:
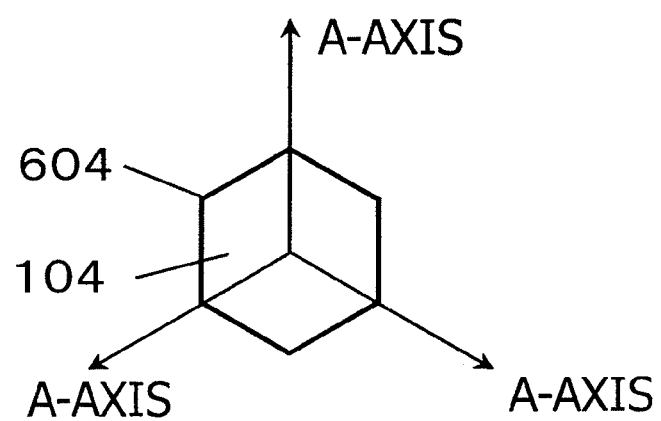
FIG. 6D is a top view of a trench before and after a first heat-treatment step in Embodiment 4.

Furthermore, an apex of a regular hexagon 603 that is patterned can be formed so as to be on a crystal axis (a axis) of the first nitride semiconductor layer 102. The respective apexes of the regular hexagon 603 are not necessarily angular. The trench 104 thus formed is, before the first heat-treatment step, as illustrated in FIG. 6C, a regular hexagon 603 formed of surfaces in parallel with a crystallographic face 109 of the first nitride semiconductor layer 102. Also after the first heat-treatment step, as illustrated in FIG. 6D, an upper geometry of the trench 104 becomes a hexagon 604 and a geometry and a size thereof hardly vary.

A production step of the present embodiment is a step effective in forming a hole 110 inside of a semiconductor with a trench diameter after the etching without varying as small as possible.

In the present Embodiment 4, a case where a main surface 103 of the first nitride semiconductor 102 is (0001) surface is illustrated. In the case where a main surface 103 is (1-100) surface, an opening 106 can be formed into a square. That is, the square is a square constituted of sides in parallel with a surface equivalent to (0001) and (10-10) surface. In addition, a side in parallel with a surface equivalent to (0001) and (10-10) surface is a side in parallel with any of <0001> direction and <10-10> direction.

EXAMPLES

In what follows, examples of the present invention will be described.

Example 1

In the present Example 1, a configurational example of a production method of a GaN-based photonic crystal surface-emitting laser will be described with reference to FIGS. 7A, 7B, 7C, 7D, 7E, 7F and 7G.

(Crystal Growth Step of Nitride Semiconductor Layer)

Firstly, a crystal growth step of a nitride semiconductor layer in the present example will be described.

Figure 7A:
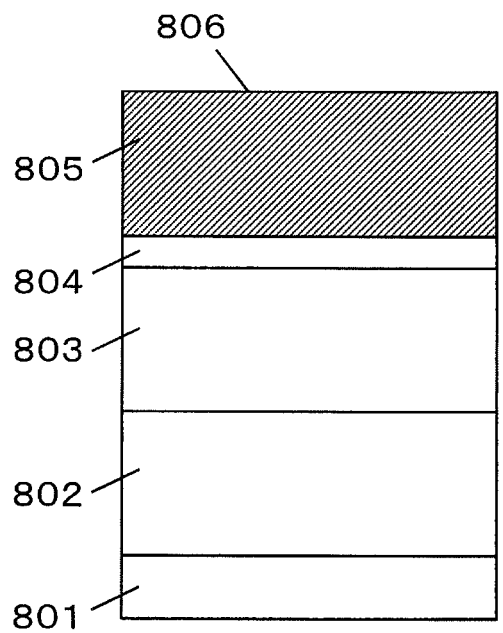
FIG. 7A is a sectional view illustrating an example of a production method in Example 1.

As illustrated in FIG. 7A, on a GaN substrate 801, n-type $Al_{0.09}Ga_{0.91}N$ that is an n-type clad layer 802, n-type GaN that is an n-type guide layer 803, an active layer 804, and p-type GaN that is a p-type guide layer 805 are sequentially grown by MOVPE. In addition, the active layer 804 forms a three-cycle multiple quantum well structure, and a material of the well layer is $In_{0.09}Ga_{0.91}N$ and a material of the barrier layer is GaN.

Furthermore, in the present example, the p-type guide layer 805 corresponds to the first nitride semiconductor layer 102 illustrated in Embodiment 1 and a main surface 806 thereof is (0001) surface.

(Step of Forming Etching Mask)

A step of forming an etching mask in the present example will be described below.

Figure 7B:
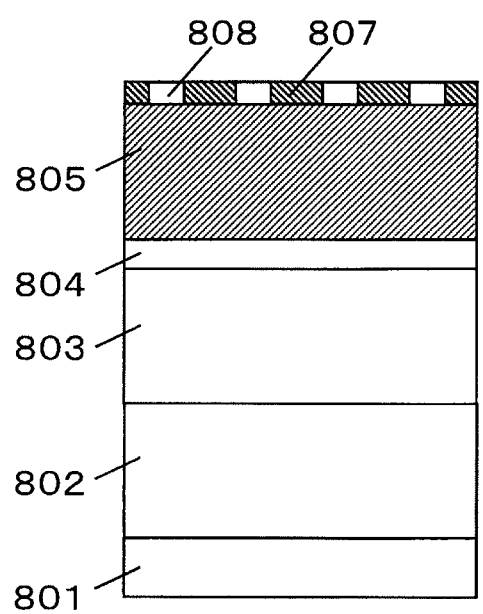
FIG. 7B is a sectional view illustrating an example of a production method in Example 1.

FIG. 7B is a diagram illustrating a step of forming an etching mask 807 for forming a photonic crystal in p-type GaN of a p-type guide layer 805. In what follows, a step of FIG. 7B will be described in order.

Firstly, on a main surface 806 of a p-type guide layer 805, a $SiO_x$ film is deposited at a thickness of 150 nm by plasma CVD (Chemical Vapor Deposition). Subsequently, in the $SiO_x$ film, a photonic crystal pattern constituted of a plurality of openings 808 is formed by electron beam lithography and ICP etching. The openings 808 have a trench diameter of 60 nm and are arranged in an in-plane direction in a regular lattice pattern with a period of 160 nm.

(Step of Forming Photonic Crystal)

Next, a step of forming a photonic crystal in the present example will be described.

Figure 7C:
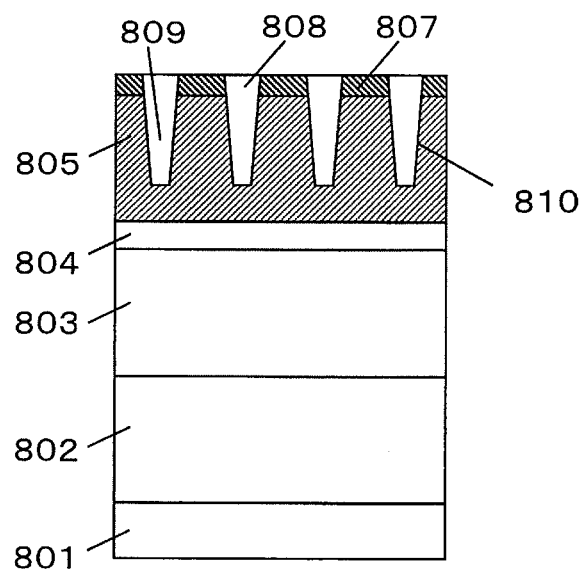
FIG. 7C is a sectional view illustrating an example of a production method in Example 1.

FIG. 7C is a diagram illustrating a step where, following the step of FIG. 7B, a p-type guide layer 805 is etched with an etching mask 807 ($SiO_x$ film) to form a photonic crystal constituted of a plurality of trenches 809. When a photonic crystal is formed, ICP dry etching process is used. The ICP gas composition is a mixed gas plasma of $Cl_2$ and Ar. A depth of a trench 809 of the photonic crystal after etching is 100 nm.

(First Heat-Treatment Step)

A first heat-treatment step in the present example will be described below.

Figure 7D:
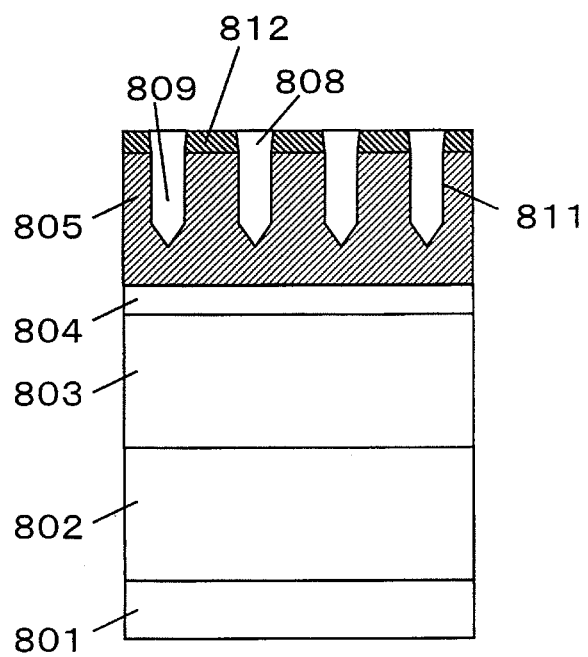
FIG. 7D is a sectional view illustrating an example of a production method in Example 1.

FIG. 7D is a diagram illustrating a first heat-treatment step that follows the step of FIG. 7C. That is, in the first heat-treatment step, a heat treatment is conducted under an atmosphere containing nitrogen element that is group V element to cause the mass transport to form a crystallographic face 811 of p-type GaN that is a material of a p-type guide layer 805 on a sidewall 810 of a trench 809 that constitutes a photonic crystal.

In the present example, the $SiO_x$ etching mask 807 used when a photonic crystal was formed is used as a heat-treating mask 812. In an atmosphere of the first heat-treatment step, $N_2$ flow rate is 10 slm (standard litter per minitus), $NH_3$ flow rate is 5 slm and heat treatment temperature is 1050 degrees Celsius. In addition, $N_2$ flow rate of 10 slm corresponds to 0.45 mol/min and $NH_3$ flow rate of 5 slm corresponds to 0.22 mol/min. Furthermore, in the first heat-treatment step of the present example, bis(cyclopentadienyl)magnesium (CP2Mg) that is a p-type dopant raw material is not flowed. However, when the heat treatment step is optimized, CP2Mg may be flowed.

Since a main surface 806 of p-type GaN that is a p-type guide layer 805 is (0001) surface, by mass transport, on a sidewall 810, (1-100) surface vertical to the main surface 806 and (1-103) surface slanted thereto are formed.

(Step of Removing Heat-Treating Mask)

A step of removing a heat-treating mask in the present example will be described below.

Figure 7E:
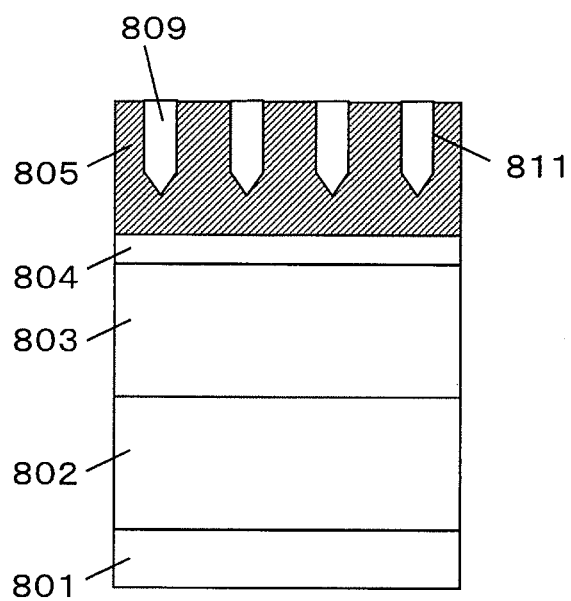
FIG. 7E is a sectional view illustrating an example of a production method in Example 1.

FIG. 7E is a diagram illustrating a step of removing a heat-treating mask 812, which follows the step of FIG. 7D. $SiO_x$ that is a heat-treating mask 812 was wet etched with buffered hydrofluoric acid.

(Second Heat-Treatment Step)

Then, a second heat-treatment step in the present example will be described.

Figure 7F:
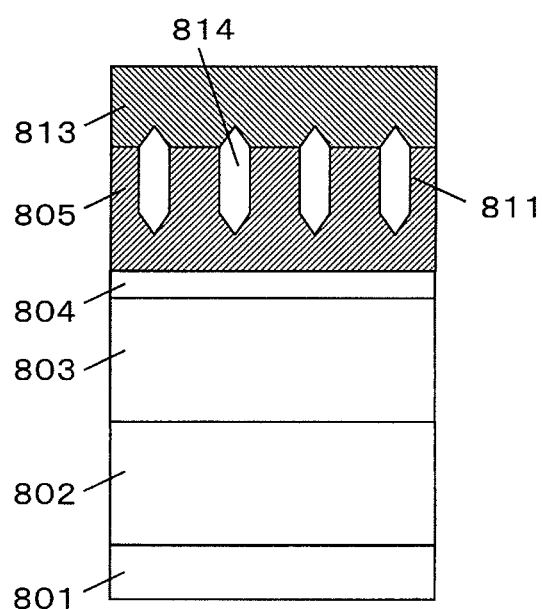
FIG. 7F is a sectional view illustrating an example of a production method in Example 1.

FIG. 7F is a diagram illustrating a second heat-treatment step that follows the step of FIG. 7E. That is, in the second heat-treatment step, a heat treatment is conducted under an atmosphere containing nitrogen element that is group V element to close an upper portion of a trench 809 of a photonic crystal with a cap layer 813 that is p-type GaN to bury the photonic crystal inside of the p-type GaN layer. In the present example, the cap layer 813 is the second nitride semiconductor layer 111 illustrated in Embodiment 1.

In an atmosphere of the second heat-treatment step, $N_2$ flow rate is 10 slm (=0.45 mol/min) and $NH_3$ flow rate is 5 slm (=0.22 mol/min). Here, in addition thereto, TMG that is a group III raw material was flowed at a flow rate of $0.1 \times (10$ to the negative 3 power) mol/min and CP2Mg that is a p-type dopant raw material was flowed at a flow rate of $0.3 \times (10$ to the negative 6 power) mol/min. A second heat treatment temperature is 1100 degrees Celsius.

As the result of the second heat-treatment step, a trench diameter of a trench 809 of a photonic crystal was 50 nm and, with a size variation before and after the heat treatment suppressing to 10 nm, a hole 814 could be formed by closing an upper portion of the photonic crystal with the cap layer 813. In addition, in the present example, an upper portion of the hole 814 was closed with surfaces equivalent to (1-102) surface and (0001) surface.

(Crystal Growth Step and Electrode Forming Step)

A crystal growth step and an electrode forming step in the present example will be described below.

Figure 7G:
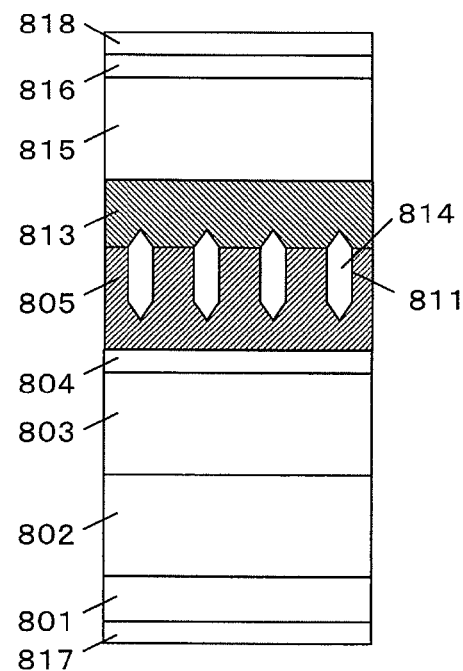
FIG. 7G is a sectional view illustrating an example of a production method in Example 1.

As illustrated in FIG. 7G, on a cap layer 813 (p-type GaN), p-type $Al_{0.09}Ga_{0.91}N$ that is a p-type clad layer 815 and p-type GaN that is a p-type contact layer 816 are sequentially grown by MOVPE process.

Then, an n-side electrode 817 of Ti/Al is formed on a back surface of a GaN substrate 801 and a p-side electrode 818 of Ti/Au is formed on a front surface of a p-type contact layer 816 by photolithography, electron beam evaporation and lift-off process. According to the step described above, a GaN-based photonic crystal surface-emitting laser that is driven in the 400-nm wavelength band can be prepared.

(Feature of Structure)

Subsequently, a feature of a structure in the present example will be described.

A hole 814 of a photonic crystal of the present example has a structure the same as that of the hole 110 of FIG. 2A. In what follows, the hole 814 in the present example will be read as a hole 110. The hole 110 has a structure where above and below a hexagonal column 201 constituted of 6 surfaces equivalent to (1-100) surface, a hexagonal cone 202 constituted of 6 surfaces equivalent to (1-101) surface is connected.

When a voltage is applied to a photonic crystal surface-emitting laser having holes such as illustrated in FIG. 2A, an electric field is more inhibited from concentrating in the vicinity of the hole 110 than the case where a voltage is applied to a hole of a circular cylinder disclosed in patent literature 1. Accordingly, there is a feature that crystal defects are generated with difficulty and a laser lifetime is extended.

Figure 8A:
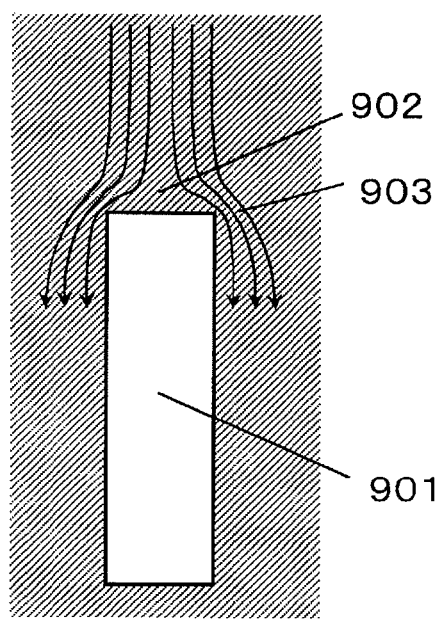
FIG. 8A is a sectional view illustrating a flow of an electric current in the vicinity of a hole of a surface-emitting laser in Example 1.
Figure 8B:
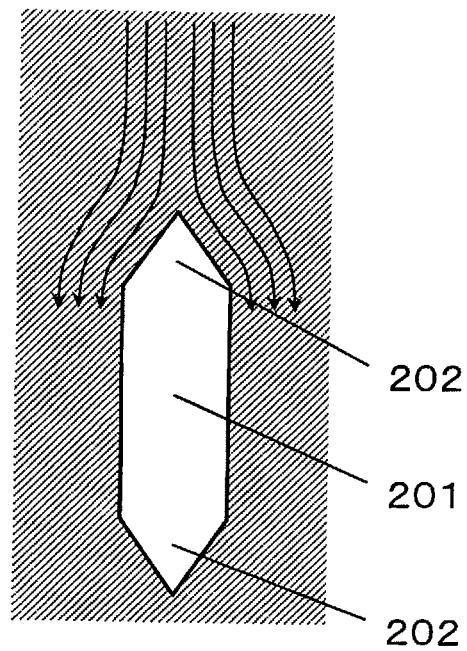
FIG. 8B is a sectional view illustrating a flow of an electric current in the vicinity of a hole of a surface-emitting laser in Example 1.
Figure 8C:
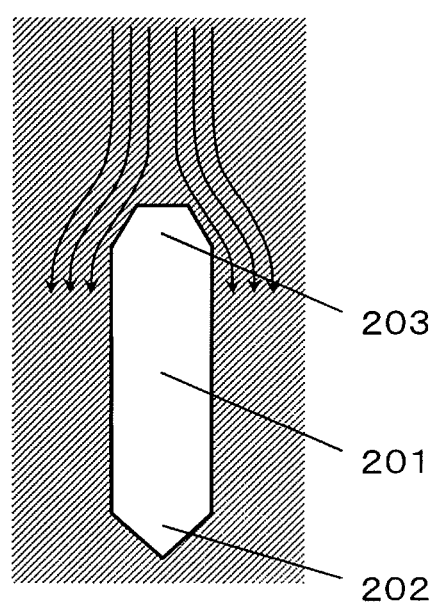
FIG. 8C is a sectional view illustrating a flow of an electric current in the vicinity of a hole of a surface-emitting laser in Example 1.

FIGS. 8A, 8B and 8C are sectional diagrams each illustrating how an electric current flows around a hole 110 when a voltage is applied to a photonic crystal laser. An arrow mark shows how an electric current flows.

In the case where a hole 110 is a circular cylinder 901, as illustrated in FIG. 8A, an electric field immediate above region 902 the circular cylinder 901 is weak and an electric field is concentrated around a corner region 903 of the circular cylinder 901. As the result thereof, crystal defects are generated from the corner region 903 to shorten the laser lifetime.

On the other hand, as illustrated in FIG. 8B, in the case of a hole 110 of the present example having hexagonal cones 202, owing to geometries of the hexagonal cones 202 above and below, there is no fluctuation in a current density and thereby an electric field concentration can be suppressed. A photonic crystal surface-emitting laser prepared according to a production method illustrated in the present example is characterized in having a long device lifetime.

Furthermore, FIG. 8C is a diagram illustrating a flow of an electric current around a hole 110 in the case when a photonic crystal surface-emitting laser is prepared from the holes 110 illustrated in FIG. 2B. In a manner similar to the case of FIG. 8B, an electric field concentration in the respective apexes of a polygon constituting a hole 110 can be alleviated. As the result thereof, there is a feature that lifetime of a laser device can be extended.

The structure like this can be prepared by use of another production method such as sticking process and the like without restricting to the production method described in the present example. Furthermore, without restricting to the photonic crystal surface-emitting laser, the above-described structure can be applied also to a photonic crystal device where an electric current is flowed in up and down direction of a hole 110.

Example 2

In the present Example 2, a configurational example of a production method of a GaN-based photonic crystal surface-emitting laser will be described with reference to FIGS. 9A, 9B, 9C, 9D, 9E, 9F and 9G. Here, in particular, an example of a production process of a structure where a distance between a photonic crystal and an active layer is neared will be described.

Figure 9A:
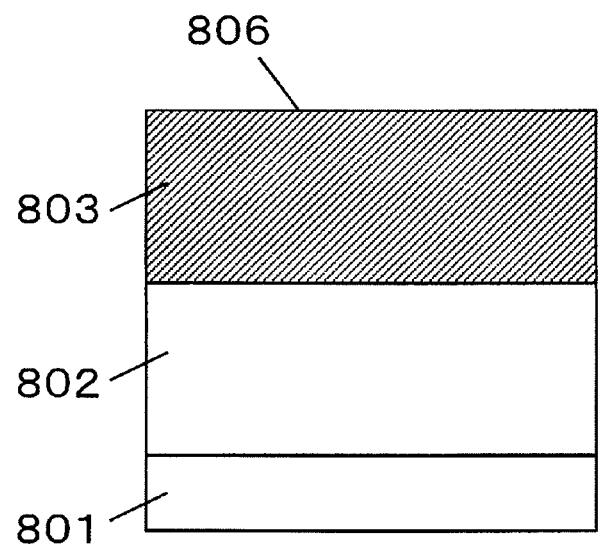
FIG. 9A is a sectional view illustrating an example of a production method in Example 2.

As illustrated in FIG. 9A, on a GaN substrate 801, n-type $Al_{0.09}Ga_{0.91}N$ that is an n-type clad layer 802 and n-type GaN that is an n-type guide layer 803 are sequentially grown by MOVPE process. In addition, in the present example, the n-type guide layer 803 corresponds to the first nitride semiconductor layer 102 illustrated in Embodiment 1 and a main surface 806 thereof is (0001) surface.

Figure 9B:
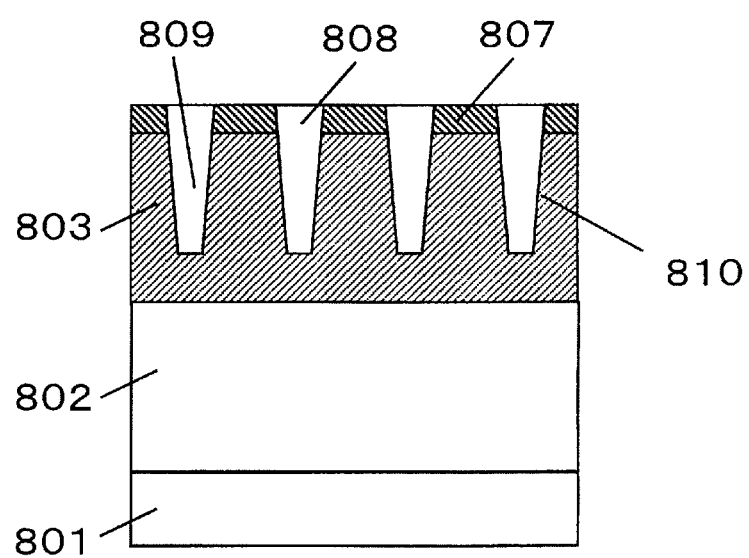
FIG. 9B is a sectional view illustrating an example of a production method in Example 2.

FIG. 9B illustrates a structure after a step where a photonic crystal is formed in a main surface 806 of an n-type guide layer 803 has gone through, and the step where a photonic crystal is formed is the same as that of Example 1. In addition, in the present example, a photonic crystal pattern is formed by arranging trenches 809 in a triangular lattice pattern with a period of 185 nm and an opening 808 is a circle having a diameter of 75 nm.

Figure 9C:
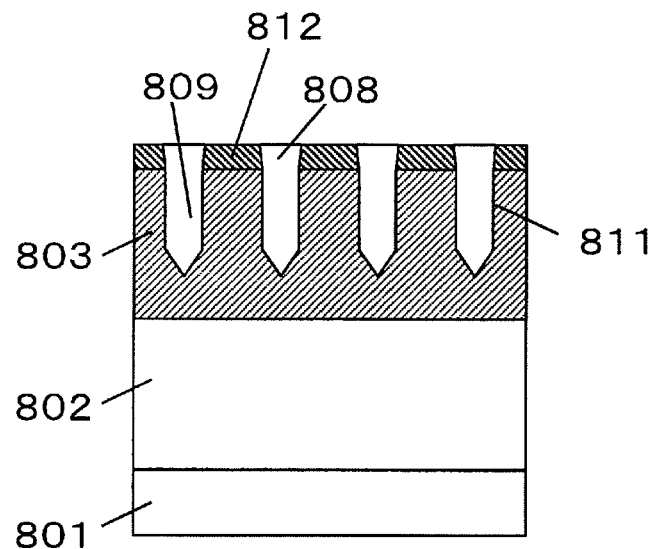
FIG. 9C is a sectional view illustrating an example of a production method in Example 2.

FIG. 9C is a diagram illustrating a first heat-treatment step that is conducted after the step of FIG. 9B. In addition, as a heat-treating mask 812 in the first heat-treatment step, the etching mask 807 used when the photonic crystal was formed is used and a material thereof is $SiO_x$. In an atmosphere in the first heat-treatment step, $N_2$ flow rate is 10 slm (=0.45 mol/min), $NH_3$ flow rate is 5 slm (=0.22 mol/min), and heat treatment temperature is 1050 degrees Celsius.

Furthermore, in the first heat-treatment step of the present example, $Si_2H_6$ that is an n-type dopant raw material is not flowed. However, from the viewpoint of optimizing the heat treatment step, $Si_2H_6$ may be flowed. In the first heat-treatment step, since a main surface 806 of an n-type guide layer 803 is (0001) surface, by mass transport, on a sidewall 810, (1-100) surface vertical to a main surface and (1-103) surface slanted thereto are formed. After the first heat-treatment step, the heat-treating mask 812 was removed with buffered hydrofluoric acid.

Figure 9D:
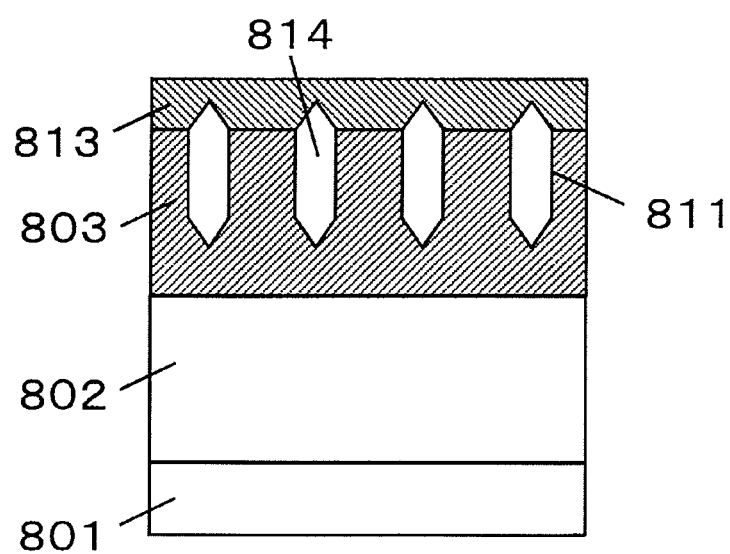
FIG. 9D is a sectional view illustrating an example of a production method in Example 2.

FIG. 9D is a diagram illustrating a second heat-treatment step. In an atmosphere of a second heat-treatment step of the present example, $N_2$ flow rate is 10 slm (=0.45 mol/min), $NH_3$ flow rate is 5 slm (=0.22 mol/min) and TMG that is a group III raw material and $Si_2H_6$ that is an n-type dopant raw material are not flowed. That is, R1=R2=0. Temperature is 1050 degrees Celsius.

As the result thereof, in the second heat-treatment step, only by mass transport of n-type GaN of an n-type guide layer 803, an upper portion of a trench 809 of a photonic crystal is closed, and thereby a thickness of a cap layer 813 (n-type GaN) can be made thinner.

In the present example, a thickness of the cap layer 813 that closes a hole 814 was 20 nm. Subsequently, on the cap layer 813, an active layer 804 is grown by MOVPE. Thereby, a distance between the hole 814 of the photonic crystal and the active layer 804 can be neared and thereby a feature that much of light generated in the active layer 804 can be diffracted by the photonic crystal can be obtained.

In addition, the active layer 804 forms a three-cycle multiple quantum well structure. A material of the well layer is $In_{0.09}Ga_{0.91}N$ and a material of a barrier layer is $In_{0.01}Ga_{0.99}N$. In the next place, P-type GaN that is a p-type guide layer 1001, p-type $Al_{0.09}Ga_{0.91}N$ that is a p-type clad layer 815 and p-type GaN that is a p-type contact layer 816 are sequentially grown by MOVPE.

In the next place, an n-side electrode 817 of Ti/Al is formed on a back surface of a GaN substrate 801 and a p-side electrode 818 of Ti/Au is formed on a front surface of a p-type contact layer 816 by electron beam evaporation.

Figure 9E:
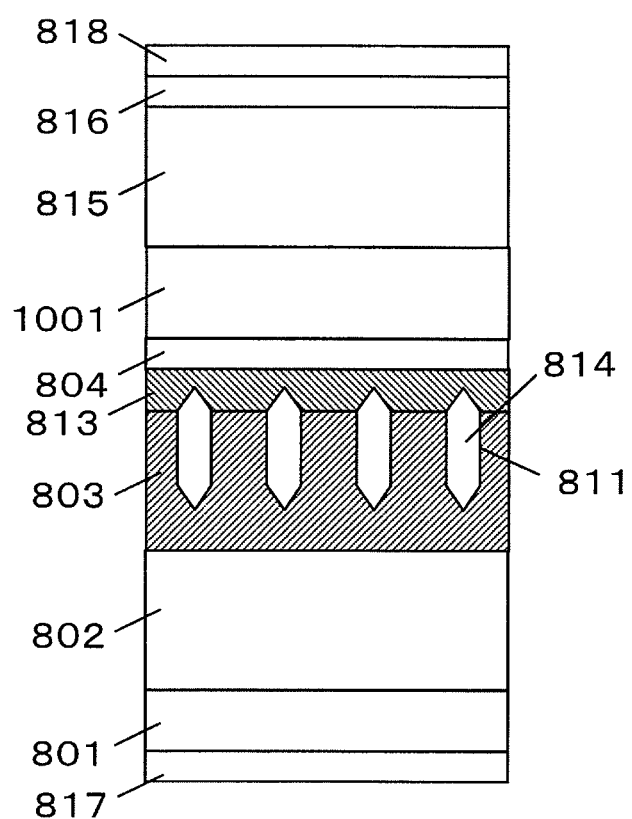
FIG. 9E is a sectional view illustrating an example of a production method in Example 2.

According to the step described above, a GaN-based photonic crystal surface-emitting laser that is driven in the 400-nm wavelength band and illustrated in FIG. 9E can be prepared.

Example 3

In the present Example 3, an constitution example of a production method of a GaN-based photonic crystal surface-emitting laser will be described.

Here, in particular, an example of a production method of a structure where a photonic crystal is formed of InGaN and air and an upper portion of a trench 809 of the photonic crystal is closed with AlGaN will be described. On a GaN substrate 801, n-type $Al_{0.05}Ga_{0.95}N$ that is an n-type clad layer 802, n-type $In_{0.02}Ga_{0.98}N$ that is an n-type guide layer 803 and an active layer 804 are sequentially grown by MOVPE.

In addition, a structure of the active layer 804 forms a three-cycle multiple quantum well structure. A material of a well layer is $In_{0.18}Ga_{0.82}N$ and a material of a barrier layer is $In_{0.02}Ga_{0.98}N$. A photonic crystal is formed in a p-type guide layer 805 (p-type $In_{0.02}Ga_{0.98}N$) grown on the active layer 804.

In addition, a main surface 806 of the p-type guide layer 805 is (0001) surface. A forming method thereof is the same as that of Example 1. The trenches 809 of the photonic crystal have a trench diameter of 70 nm and a depth of 200 nm and are arranged in a plane of a p-type guide layer 805 (p-type $In_{0.02}Ga_{0.98}N$) in a tetragonal lattice pattern with a period of 185 nm.

In an atmosphere in a first heat-treatment step conducted subsequently in the present example, $N_2$ flow rate is 10 slm (=0.45 mol/min), $NH_3$ flow rate is 5 slm (=0.22 mol/min) and heat treatment temperature is 900 degrees Celsius. Furthermore, in the first heat-treatment step of the present example, CP2Mg that is a p-type dopant raw material is not flowed. However, from the viewpoint of optimizing the heat treatment step, CP2Mg may be flowed.

As the result of the first heat-treatment step, on a sidewall 810, (1-100) surface vertical to and (1-102) surface slanted to a main surface are formed. Then, $SiO_x$ that is a heat-treating mask 812 was wet etched with buffered hydrofluoric acid.

In a second heat-treatment step conducted subsequently in the present example, an upper portion of a trench 809 of a photonic crystal is closed with p-type $Al_{0.05}Ga_{0.95}N$. That is, a cap layer 813 is p-type $Al_{0.05}Ga_{0.95}N$. In an atmosphere in the second heat-treatment step, $N_2$ flow rate is 20 slm (=0.89 mol/min) and $NH_3$ flow rate is 5 slm (=0.22 mol/min).

Herein, in addition thereto, TMG that is a group III raw material was flowed at a flow rate of 95 micromoles per minute, TMA that is a group III raw material was flowed at a flow rate of 5 micromoles per minute, and CP2Mg that is a p-type dopant raw material was flowed at a flow rate of 0.3 micromoles per minute. Second heat treatment temperature is 1050 degrees Celsius. Since a second heat treatment temperature is 1050 degrees Celsius and high to p-type $In_{0.02}Ga_{0.98}N$, desorption may be violent. However, in the present Example 3, in the first heat-treatment step, a stable crystallographic face 811 was formed on a sidewall 810 of a trench, accordingly, an influence thereof was small.

As the result of the second heat-treatment step, a trench diameter of a hole 814 of a photonic crystal is 60 nm. With a size variation before and after the heat treatment step suppressing to 10 nm, an upper portion of a trench 809 of the photonic crystal could be closed with a cap layer 813 (p-type $Al_{0.05}Ga_{0.95}N$). In addition, the cap layer 813 (p-type $Al_{0.05}Ga_{0.95}N$) can work as a p-type clad layer 815, and, in the present example, as illustrated in FIG. 10, a thickness of the cap layer 813 was grown to a thickness to an extent the same as that of the p-type clad layer 815.

Subsequently, on a cap layer 813, p-type GaN that is a p-type contact layer 816 is grown sequentially by MOVPE.

In the next place, an n-side electrode 817 of Ti/Al is formed on a back surface of a GaN substrate 801 and a p-side electrode 818 of Ti/Au is formed on a front surface of a p-type contact layer 816 by photolithography, an electron beam evaporation process and a lift-off process.

Figure 10:
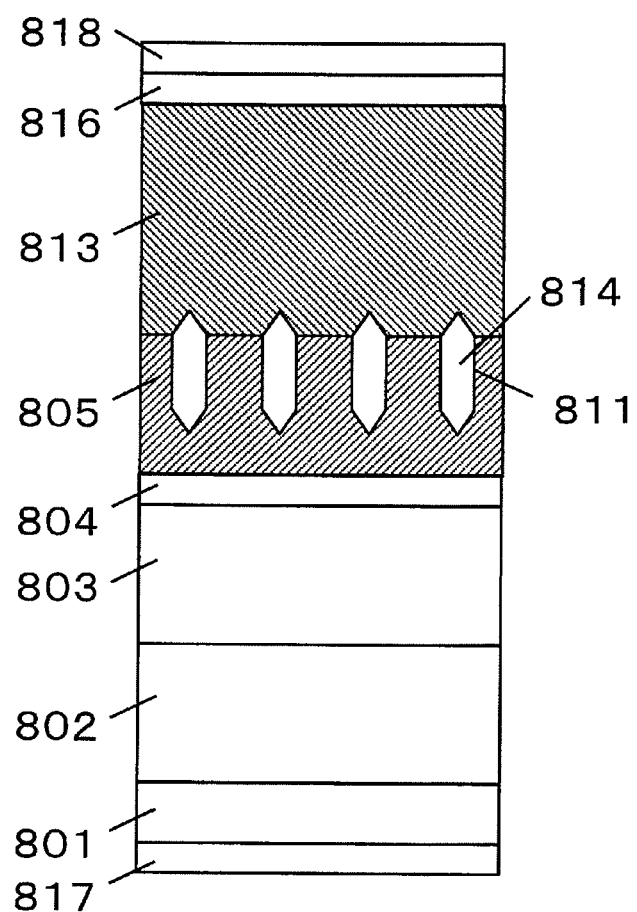
FIG. 10 is a sectional view illustrating an example of a surface-emitting laser in Example 3.

According to the step described above, a GaN-based photonic crystal surface-emitting laser such as shown in FIG. 10 driven in the 450-nm wavelength band can be prepared.

Example 4

In the present Example 4, a constitution example of a production method of a GaN-based photonic crystal surface-emitting laser will be described.

Here, in particular, an example of a production method of a structure where a photonic crystal is formed of AlGaN and air and an upper portion of a trench 809 of the photonic crystal is closed with InGaN will be described. On a GaN substrate 801, n-type $Al_{0.05}Ga_{0.95}N$ that is an n-type clad layer 802 is grown by MOVPE process. In addition, a main surface 806 of the n-type clad layer 802 is (0001) surface.

In the present example, a trench 809 of a photonic crystal is formed in an n-type clad layer 802. A forming method thereof is the same as that of Example 2.

In a structure of trenches 809 of a photonic crystal, by use of a process shown in Embodiment 4, hexagonal columns having a separation between opposite sidewalls of 70 nm and a depth of 200 nm are formed and arranged in a tetragonal lattice pattern with a period of 185 nm in a plane of an n-type clad layer 802 (n-type $Al_{0.05}Ga_{0.95}N$ layer).

In an atmosphere of a first heat-treatment step that follows in the present example, $N_2$ flow rate is 20 slm (=0.89 mol/min), $NH_3$ flow rate is 5 slm (=0.22 mol/min) and heat treatment temperature is 1100 degrees Celsius.

Furthermore, in the first heat-treatment step of the present example, $Si_2H_6$ that is an n-type dopant raw material is not flowed. However, from the viewpoint of optimizing the heat treatment step, $Si_2H_6$ may be flowed. As the result of the first heat-treatment step, on a sidewall 810, (1-100) surface vertical to and (1-101) surface slanted to a main surface 806 are formed. Then, $SiO_x$ that is a heat-treating mask 812 was wet etched with buffered hydrofluoric acid.

In a second heat-treatment step conducted subsequently in the present example, an upper portion of a trench 809 of a photonic crystal is closed with n-type $In_{0.02}Ga_{0.98}N$. That is, a cap layer 813 is n-type $In_{0.02}Ga_{0.98}N$. In an atmosphere in a second heat-treatment step, $N_2$ flow rate is 15 slm (=0.67 mol/min) and $NH_3$ flow rate is 5 slm (=0.22 mol/min).

Herein, in addition thereto, TMG that is a group III raw material was flowed at a flow rate of 50 micromoles per minute, TMI that is a group III raw material was flowed at a flow rate of 20 micromoles per minute, and $Si_2H_6$ that is an n-type dopant raw material was flowed at a flow rate of $5 \times (10$ to the negative 3 power) micrometers per minute. Second heat treatment temperature is 850 degrees Celsius.

As the result of the second heat-treatment step, a trench diameter of a trench 809 of a photonic crystal was 70 nm. That is, while hardly varying a size before and after the heat treatment, an upper portion of a trench 809 of the photonic crystal could be closed with n-type $In_{0.02}Ga_{0.98}N$. In the present example, a cap layer 813 (n-type $In_{0.02}Ga_{0.98}N$) doubles as an n-type guide layer 803.

Subsequently, an active layer 804 is grown by MOVPE. In addition, the active layer 804 forms a three-cycle multiple quantum well structure. A material of a well layer is $In_{0.18}Ga_{0.82}N$ and a material of a barrier layer is $In_{0.02}Ga_{0.98}N$. p-type $In_{0.02}Ga_{0.98}N$ that is a p-type guide layer 1001, a p-type $Al_{0.05}Ga_{0.95}N$ layer that is a p-type clad layer 815 and p-type GaN that is a p-type contact layer 816 are sequentially grown by MOVPE.

Subsequently, an n-side electrode 817 of Ti/Al is formed on a back surface of a GaN substrate 801 and a p-side electrode 818 of Ti/Au is formed on a front surface of a p-type contact layer 816 by electron beam evaporation.

Figure 11:
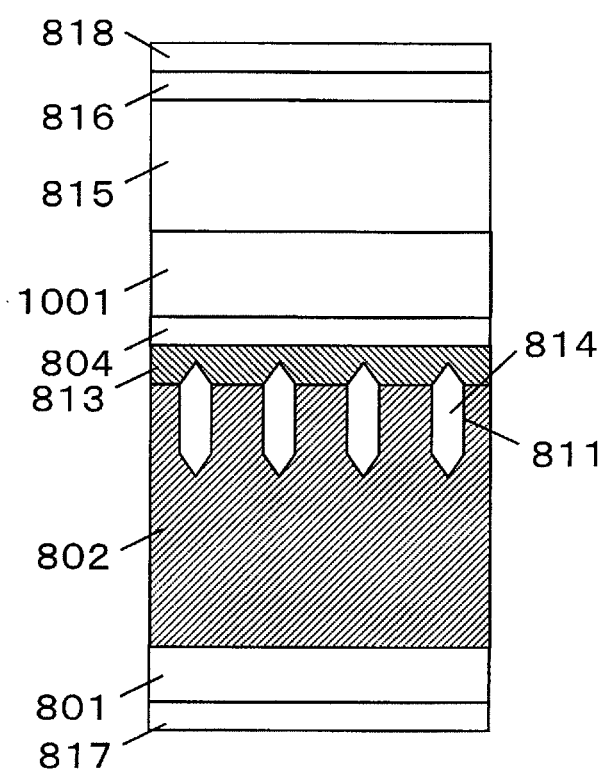
FIG. 11 is a sectional view illustrating an example of a surface-emitting laser in Example 4.

According to the steps described above, a GaN-based photonic crystal surface-emitting laser such as illustrated in FIG. 11 and driven in the 450-nm wavelength band can be prepared.

This application claims the benefit of Japanese Patent Application No. 2009-178421, filed on Jul. 30, 2009, which is hereby incorporated by reference herein in its entirety.

REFERENCE SIGNS LIST

100: Semiconductor structure
101: Substrate

102: First nitride semiconductor layer
103: Main surface
104: Trench
105: Etching mask
106: Opening
107: Sidewall
108: Heat-treating mask
109: Crystallographic face
110: Hole
111: Second nitride semiconductor layer

The invention claimed is:

1. A structure comprising a substrate and a semiconductor layer including a nitride semiconductor,
wherein a hole is formed in the semiconductor layer,
wherein the hole comprises a first portion having a substantial prism shape formed of a plurality of faces substantially perpendicular to an in-plane direction of the substrate and a second portion adjacently connected to the first portion and having a pyramid or truncated pyramid shape formed of a plurality of faces being not perpendicular to the in-plane direction of the substrate and inclined with respect to the in-plane direction of the substrate, and
wherein a crystallographic face of the nitride semiconductor is formed on at least a part of the plurality of faces constituting the first portion of the hole and at least a part of the plurality of faces constituting the second portion of the hole.

2. The structure according to claim 1, wherein the substantial prism shape of the first portion of the hole comprises a hexagonal column and the pyramid shape of the second portion of the hole comprises a hexagonal cone.

3. The structure according to claim 1, wherein the substantial prism shape of the first portion of the hole comprises a hexagonal column and the pyramid shape of the second portion of the hole comprises an octahedron.

4. The structure according to claim 1, wherein a separation of opposite sidewall surfaces of the hole is 1 μm or less.

5. The structure according to claim 1, wherein an aspect ratio of the hole is 2 or more.

6. The structure according to claim 1, wherein a diameter of the hole is 300 nm or less, and an aspect ratio of the hole is 2 or less.

7. The structure according to claim 1, wherein a diameter of the hole is 150 nm or less.

8. The structure according to claim 1, wherein the semiconductor layer comprises a first nitride semiconductor layer and a second nitride semiconductor layer.

9. The structure according to claim 1, wherein the semiconductor layer includes at least one of a group III element.

10. The structure according to claim 1, wherein the semiconductor layer includes at least one of GaN, AlN, AlGaN, InGaN and InN.

11. The structure according to claim 1, wherein the hole is closed by the nitride semiconductor.

12. A surface-emitting laser comprising the structure according to claim 1 and an active layer.

13. The structure according to claim 1, wherein a first crystallographic face of the nitride semiconductor is formed on the at least a part of the plurality of faces constituting the first portion of the hole and a second crystallographic face of the nitride semiconductor is formed on the at least a part of the plurality of faces constituting the second portion of the hole.

14. The structure according to claim 13, wherein a crystallographic pattern of the first crystallographic face is different from a crystallographic pattern of the second crystallographic face.

15. The structure according to claim 13, wherein the first crystallographic face is a surface equivalent to either of a (0001) surface or a (1-10n (wherein, n is an integer of 0 to 4)) surface.

16. The structure according to claim 15, wherein the second crystallographic face is a surface equivalent to either of a (0001) surface or a (1-10n (wherein, n is an integer of 0 to 4)) surface.

* * * * *